(12) United States Patent
Then et al.

(10) Patent No.: US 11,101,380 B2
(45) Date of Patent: Aug. 24, 2021

(54) GROUP III-NITRIDE INTEGRATED FRONT-END CIRCUIT

(71) Applicant: INTEL CORPORATION, Santa Clara, CA (US)

(72) Inventors: Han Wui Then, Portland, OR (US); Sansaptak Dasgupta, Hillsboro, OR (US); Marko Radosavljevic, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/475,220

(22) PCT Filed: Feb. 2, 2017

(86) PCT No.: PCT/US2017/016162
§ 371 (c)(1),
(2) Date: Jul. 1, 2019

(87) PCT Pub. No.: WO2018/143987
PCT Pub. Date: Aug. 9, 2018

(65) Prior Publication Data
US 2019/0355843 A1 Nov. 21, 2019

(51) Int. Cl.
*H01L 29/778* (2006.01)
*H01L 21/762* (2006.01)
(Continued)

(52) U.S. Cl.
CPC .... *H01L 29/7786* (2013.01); *H01L 21/76224* (2013.01); *H01L 29/0847* (2013.01);
(Continued)

(58) Field of Classification Search
CPC .......... H01L 29/7786; H01L 21/76224; H01L 29/0847; H01L 29/2003; H01L 29/42376;
(Continued)

(56) References Cited

U.S. PATENT DOCUMENTS

2005/0067716 A1   3/2005  Mishra et al.
2006/0226415 A1   10/2006 Nishijima et al.
(Continued)

FOREIGN PATENT DOCUMENTS

WO     2015157701 A1   10/2015

OTHER PUBLICATIONS

International Search Report and Written Opinion of the International Searching Authority for International Application No. PCT/US2017/016162 dated Oct. 25, 2017, 10 pages.

*Primary Examiner* — Shahed Ahmed
(74) *Attorney, Agent, or Firm* — Schwabe, Williamson & Wyatt, P.C.

(57) ABSTRACT

An apparatus, an integrated circuit die, and a method of fabricating a group III-nitride (III-N) integrated RF front-end circuit are disclosed. The apparatus includes a III-N integrated radio frequency (RF) front-end circuit that includes a semiconductor substrate, a plurality of functional blocks, each of the plurality of functional blocks comprising a III-N structure on the semiconductor substrate. The III-N integrated RF front-end circuit is to be coupled to an antenna.

21 Claims, 18 Drawing Sheets

(51) Int. Cl.
*H01L 29/08* (2006.01)
*H01L 29/20* (2006.01)
*H01L 29/423* (2006.01)
*H01L 29/66* (2006.01)
*H04B 1/16* (2006.01)

(52) U.S. Cl.
CPC .... *H01L 29/2003* (2013.01); *H01L 29/42376* (2013.01); *H01L 29/66462* (2013.01); *H04B 1/16* (2013.01)

(58) Field of Classification Search
CPC ..... H01L 29/66462; H01L 29/122–127; H01L 29/15–158; H01L 29/778–7789; H01L 29/20–2006; H01L 29/66431; H01L 2924/13064; H01L 29/4236; H01L 29/0657; H01L 29/0673; H04B 1/16; H04B 1/04
See application file for complete search history.

(56) References Cited

U.S. PATENT DOCUMENTS

| | | | |
|---|---|---|---|
| 2009/0174014 A1 | 7/2009 | Kunze et al. | |
| 2012/0194276 A1 | 8/2012 | Fisher | |
| 2013/0214693 A1* | 8/2013 | Huang | H05B 45/37 315/201 |
| 2015/0199949 A1* | 7/2015 | Fishman | G10H 3/14 84/726 |
| 2017/0110451 A1* | 4/2017 | Fraser | H03K 17/6871 |
| 2019/0312014 A1* | 10/2019 | Or-Bach | H01L 21/6835 |

\* cited by examiner

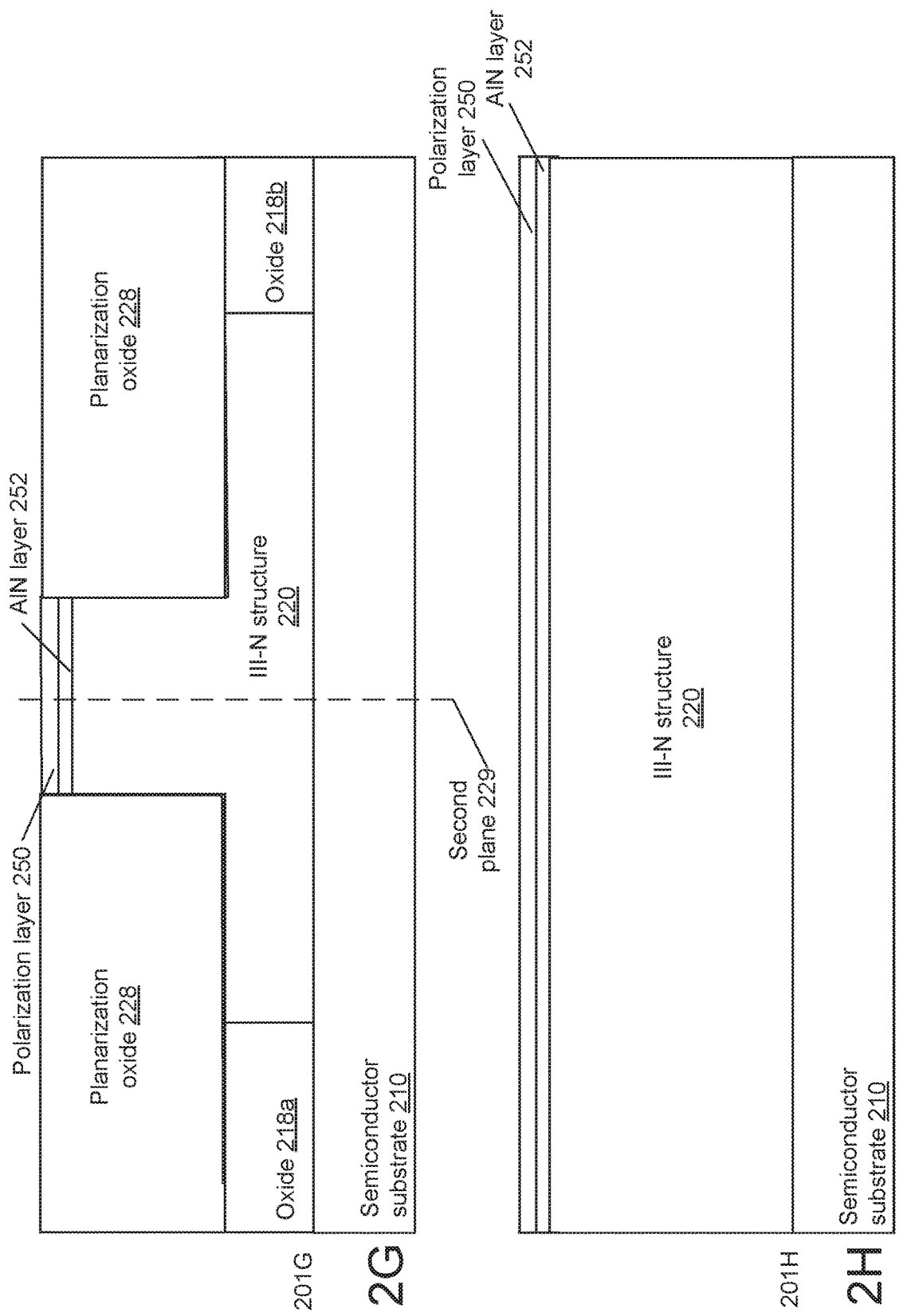

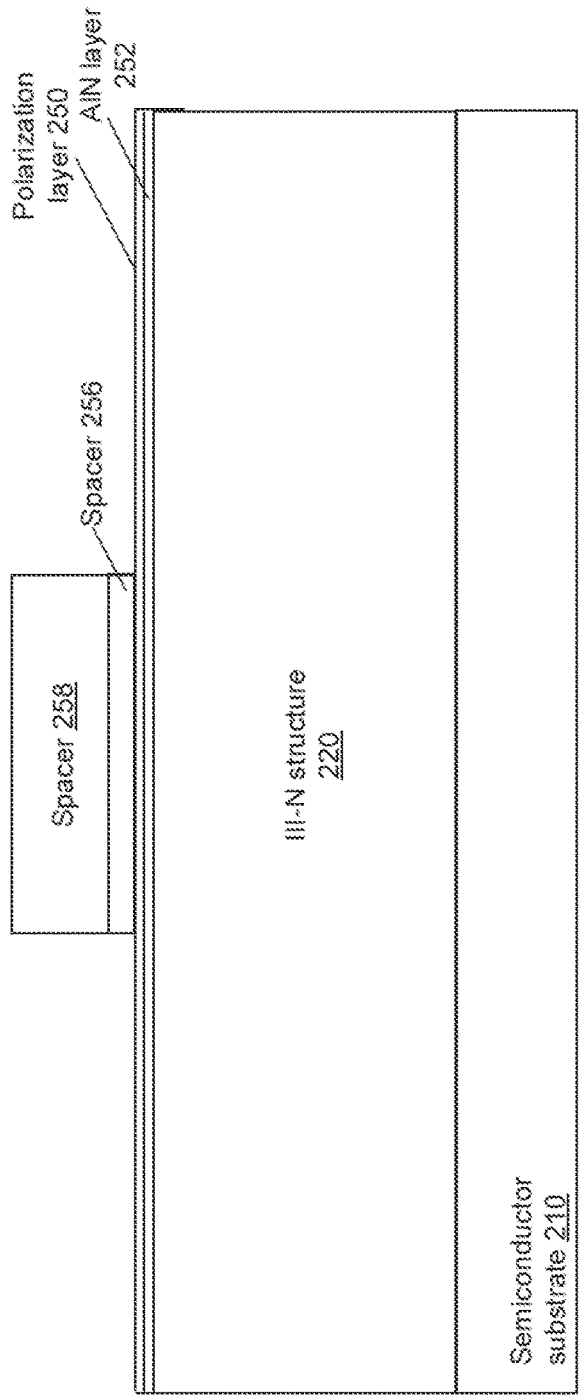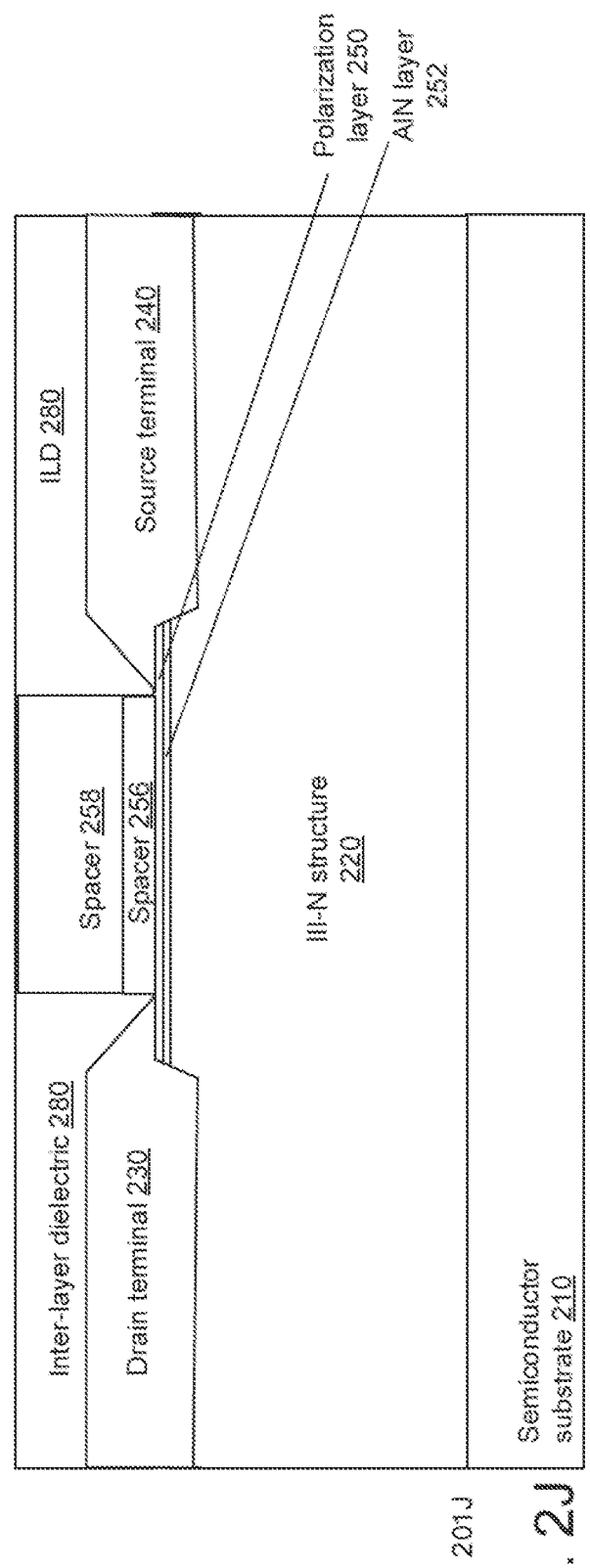

GROUP III-NITRIDE INTEGRATED FRONT-END CIRCUIT

CROSS-REFERENCE TO RELATED APPLICATIONS

This patent application is a U.S. National Phase Application under 35 U.S.C. § 371 of International Application No. PCT/US2017/016162, filed on Feb. 2, 2017, the entire contents of which is hereby incorporated by reference herein.

BACKGROUND

Wireless communication devices include a radio frequency (RF) front-end circuit coupled to an antenna. The RF front-end circuit includes functional blocks including a voltage regulator (VR), a power amplifier (PA), a low-noise amplifier (LNA), a switch, logic, and filters. Power may be lost as signals are transferred between the functional blocks of the RF front-end circuit.

BRIEF DESCRIPTION OF THE DRAWINGS

The present disclosure described herein is illustrated by way of example and not by way of limitation in the accompanying figures. For simplicity and clarity of illustration, features illustrated in the figures are not necessarily drawn to scale. For example, the dimensions of some features may be exaggerated relative to other features for clarity. Further, where considered appropriate, reference labels have been repeated among the figures to indicate corresponding or analogous elements.

DETAILED DESCRIPTION

Figure 1A:
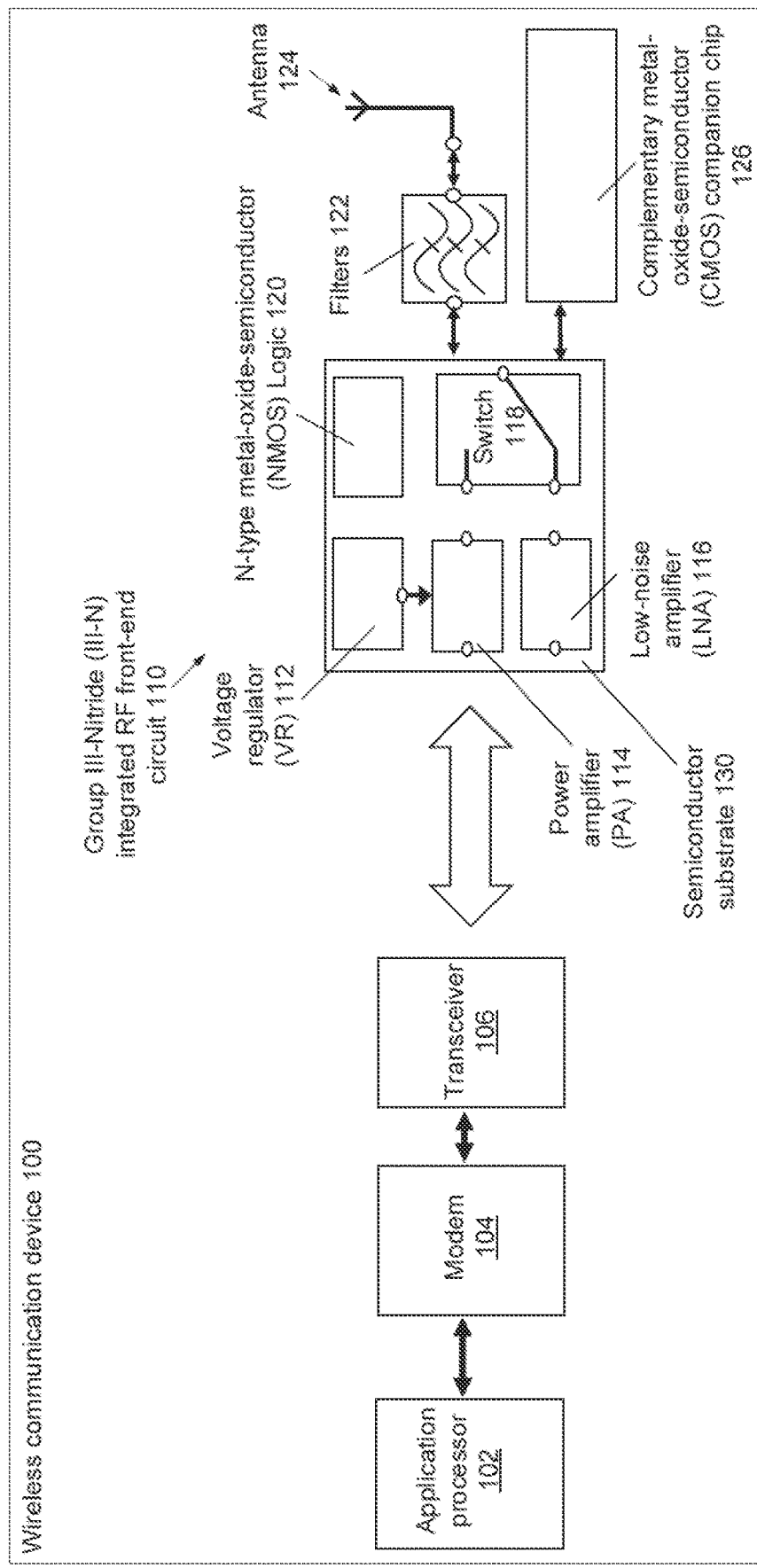
FIGS. 1A-C illustrate a wireless communication device including a group III-nitride (III-N) integrated RF front-end circuit, according to an implementation of the present disclosure.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Wireless communication devices include an antenna to transmit and receive signals and an RF front-end circuit to process the signals. RF front-end circuits include different functional blocks and each functional block may be on a different semiconductor substrate and may be implemented in different types of technology. Different functional blocks may be implemented in gallium arsenide (GaAs) heterojunction bipolar transistor (HBT), GaAs high-electron-mobility transistor (HEMT), silicon (Si) bulk complementary-metal-oxide-semiconductor (CMOS), aluminum nitride (AlN) film bulk acoustic resonators (FBAR), or bulk acoustic ware (BAW). For example, the VR may be implemented in Si, the PA in GaAs, the LNA GaAs, and a switch in silicon on insulator (SOI). By having functional blocks on different semiconductor substrates, an RF circuit can have a 5-10% power loss due to transfer of signals between functional blocks.

The present disclosure addresses the above-mentioned and other deficiencies by using a III-N integrated RF front-end circuit. The III-N integrated RF front-end circuit includes two or more functional blocks of VR, PA, LNA, n-type metal-oxide-semiconductor logic (NMOS) logic, or a switch on the same semiconductor substrate. Each functional block on the same semiconductor substrate includes a III-N structure on the semiconductor substrate. The 5-10% power loss is avoided by providing the functional blocks on the same semiconductor substrate.

The III-N used in the integrated RF front-end circuit may be gallium nitride (GaN). Each functional block may include one or more GaN transistors. GaN transistors outperform GaAs and Si technology in VR, PA, LNA, and switch in terms of RF power output, RF power-added efficiency, transistor on-resistance (e.g., a built-in parameter of a component that represents the component's internal resistance when the component is in a fully conducting state), larger breakdown voltage, lower noise figure, smaller capacitance, and lower losses. Filters may be integrated in the form of a multi-chip package with the monolithic III-N chip.

Monolithic integration of functional blocks with III-N technology (e.g., III-N integrated RF front-end circuit) offers reduction in form factor and reduces parasitic losses by removing the package interfaces between the discrete functional blocks (e.g., modules). Reducing the losses allows higher frequency bands (e.g., $5^{th}$ generation (5G) bands (3.5-6 gigahertz (GHz) and millimeter wave (e.g., 27-32 GHz))) to be deployed for high bandwidth wireless communications.

Figure 1B:
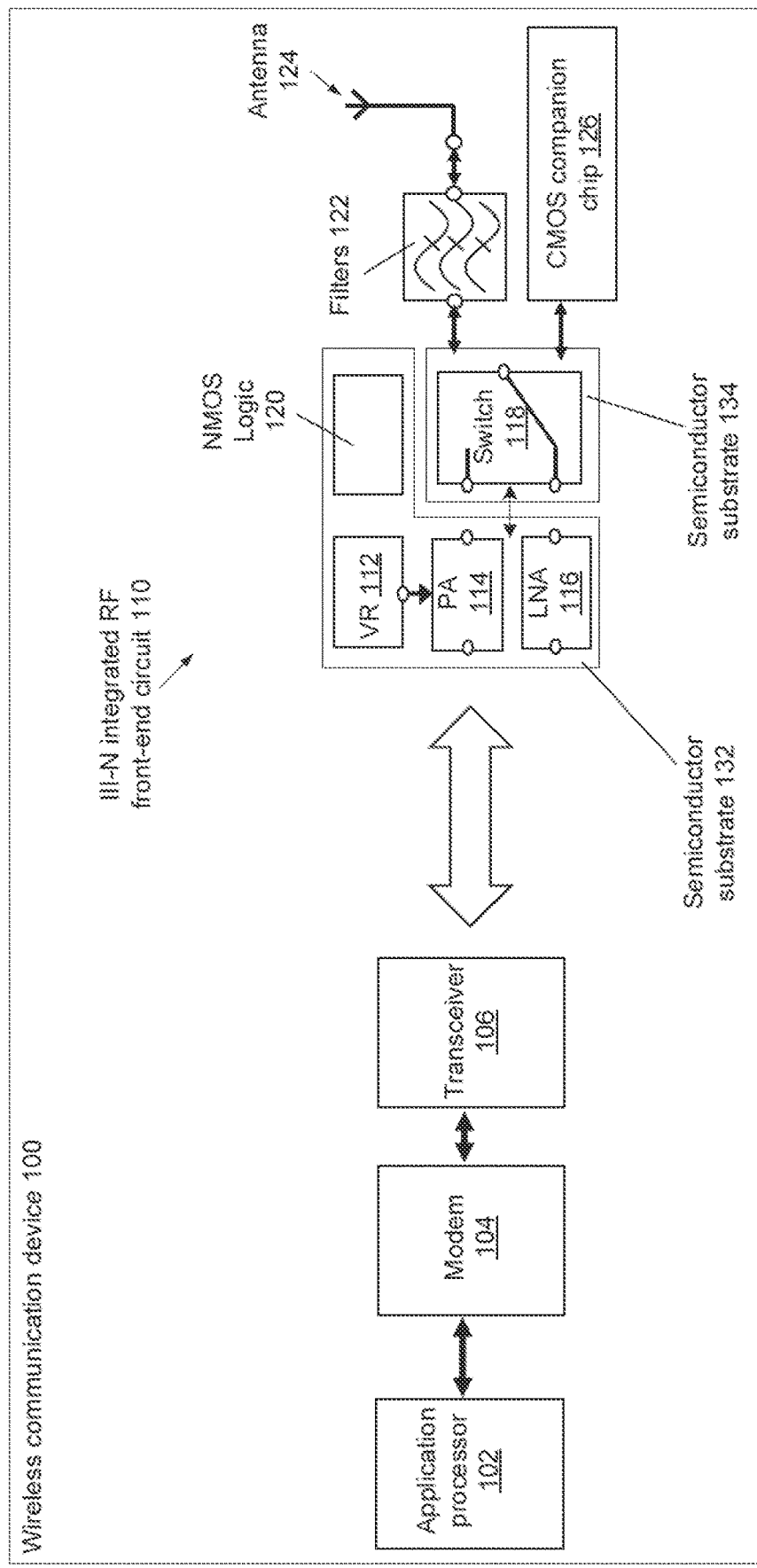
Figure 1C:
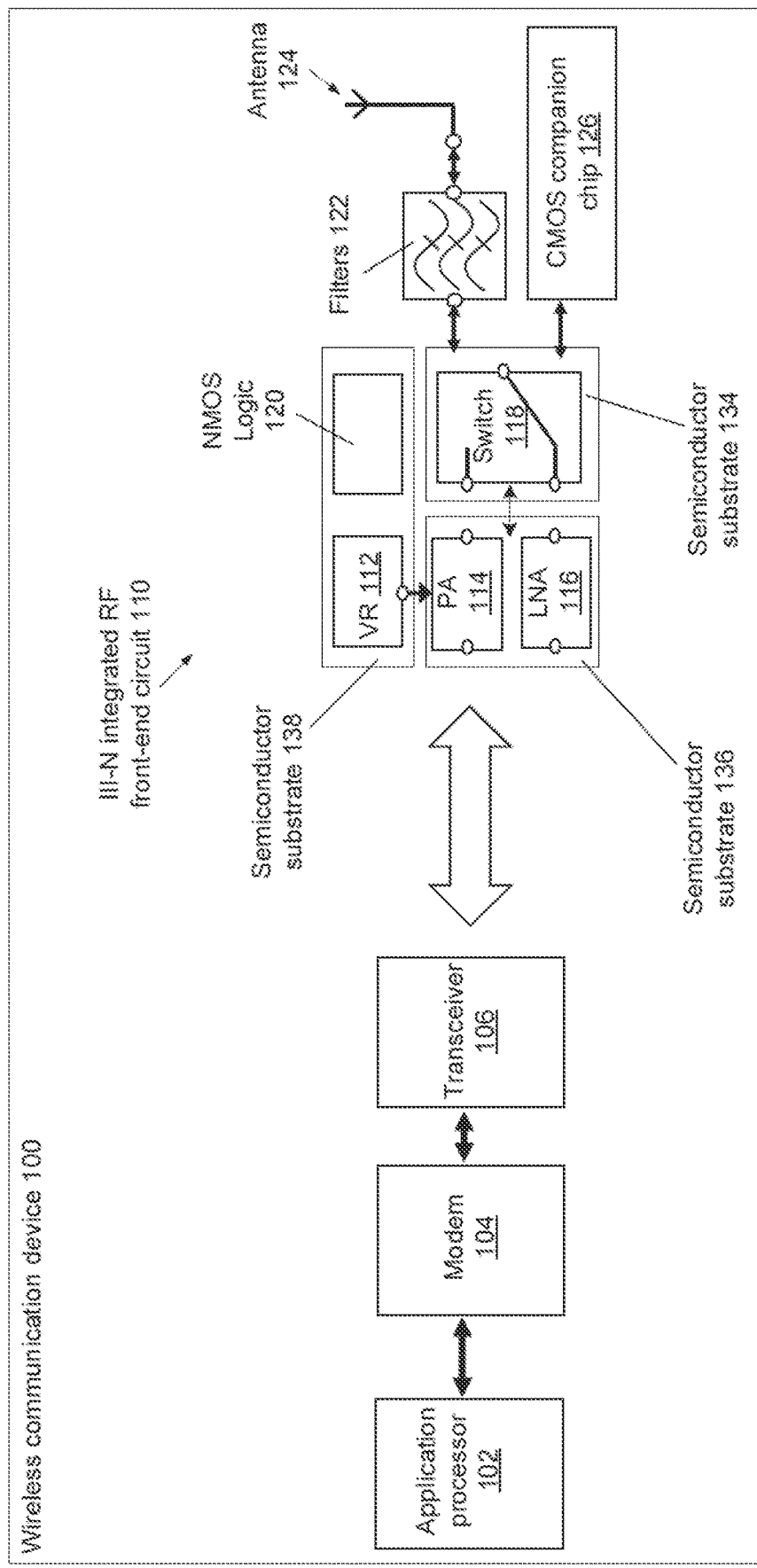

FIGS. 1A-C illustrate a wireless communication device 100 (e.g., an apparatus) including a III-N integrated RF front-end circuit 110, according to an implementation of the present disclosure. In one implementation, a wireless communication device includes an application processor 102, a modem 104, and a transceiver 106, a III-N integrated RF front-end circuit 110, filters 122, an antenna 124, and a CMOS companion chip 126. The application processor 102 may be coupled to the modem 104 and the modem may be coupled to the transceiver 106. The transceiver 106 may be coupled to the III-N integrated RF front-end circuit 110. In one implementation, the III-N integrated RF front-end circuit 110 is to be coupled to the antenna 124. In one implementation, the III-N integrated RF front-end circuit 110 is to be coupled to the CMOS companion chip 126. One or more filters 122 and the filters 122 may be coupled to antenna 124. The III-N integrated RF front-end circuit 110 is also coupled to the CMOS companion chip 126. The CMOS companion chip 126 may be a silicon (Si) CMOS companion chip and may include memory and registers.

The III-N integrated RF front-end circuit 110 includes a semiconductor substrate 130, functional blocks, and an interface to be coupled to an antenna 124 (e.g., an interface to be coupled to filters 122 which is to be coupled to antenna 124). Each of the functional blocks include a III-N structure on the semiconductor substrate 130 (see FIG. 2). The functional blocks include two or more of VR 112, PA 114, LNA 116, switch 118 (e.g., a single pole switch, double pole switch), and NMOS logic 120. The III-N structure includes a group III element (e.g., aluminum (Al), gallium (Ga), indium (In), etc.). In one implementation, the III-N structure is a gallium nitride (GaN) structure. In another implementation, the III-N structure is an aluminum nitride (AlN) structure. In another implementation, the III-N structure is an aluminum indium nitride (AlInN) structure. In another implementation, the III-N structure is an aluminum gallium nitride (AlGaN) structure. In one implementation, each of the III-N structures on the semiconductor substrate 130 is the same type of III-N (e.g., GaN). In another implementation, two or more of the III-N structures on the semiconductor substrate 130 are different types of III-N (e.g., GaN structure and AlN structure).

In one implementation, each of the functional blocks may include a gallium nitride (GaN) structure above the semiconductor substrate, source terminals on the GaN structure, drain terminals on the GaN structure, and gate terminals above the GaN structure. Each of the gate terminals is between a source terminal of the source terminals and a drain terminal of the drain terminals. (See FIG. 4.)

Referring to FIG. 1A, in one implementation, VR 112, PA 114, LNA 116, switch 118, and NMOS logic 120 are on semiconductor substrate 130. Each of VR 112, PA 114, LNA 116, switch 118, and NMOS logic 120 include a III-N structure on the semiconductor substrate 130 (see FIG. 2). In FIG. 1A, the functional blocks include PA 114 including a first III-N structure on the semiconductor substrate 130, LNA 116 including a second III-N structure on the semiconductor substrate 130, VR 112 including a third III-N structure on the semiconductor substrate 130, NMOS logic 120 including a fourth III-N structure on the semiconductor substrate 130, and switch 118 including a fifth III-N structure on the semiconductor substrate 130.

Referring to FIG. 1B, in another implementation, VR 112, PA 114, LNA 116, and NMOS logic 120 are on semiconductor substrate 132 and switch 118 is on semiconductor substrate 134. At least each of VR 112, PA 114, LNA 116, and NMOS logic 120 include a III-N structure on the semiconductor substrate 132. In one implementation, switch 118 includes a III-N structure on the semiconductor substrate 134. At least one of the functional blocks on semiconductor substrate 132 is coupled to the switch 118 on semiconductor substrate 134. At least one of semiconductor substrate 132 or semiconductor substrate 134 is coupled to an interface to be coupled to the antenna 124.

In FIG. 1B, a first set of functional blocks include PA 114 including a first III-N structure on the semiconductor substrate 132, LNA 116 including a second III-N structure on the semiconductor substrate 132, VR 112 including a third III-N structure on the semiconductor substrate 132, NMOS logic 120 including a fourth III-N structure on the semiconductor substrate 132. Switch 118 may include a fifth III-N structure on the semiconductor substrate 134.

Referring to FIG. 1C, in another implementation, switch 118 is on semiconductor substrate 134, PA 114 and LNA 116 are on semiconductor substrate 136, and VR 112 and NMOS logic 120 are on semiconductor substrate 138. In one implementation, each of VR 112 and NMOS logic 120 include a III-N structure on the semiconductor substrate 138. In one implementation, each of PA 114 and LNA 116 include a III-N structure on the semiconductor substrate 136. In one implementation, switch 118 includes a III-N structure on the semiconductor substrate 134. At least one of the functional blocks on semiconductor substrate 138 is coupled to at least one of switch 118 on semiconductor substrate 134, PA 114 on semiconductor substrate 136, or LNA 116 on semiconductor substrate 136. At least one of the functional blocks on semiconductor substrate 136 is coupled to at least one of switch 118 on semiconductor substrate 134, VR 112 on semiconductor substrate 138, or NMOS logic 120 on semiconductor substrate 138. At least one of semiconductor substrate 134, semiconductor substrate 136, or semiconductor substrate 138 is coupled to an interface to be coupled to the antenna 124.

In FIG. 1C, a first set of functional blocks include PA 114 including a first III-N structure on the semiconductor substrate 136 and LNA 116 including a second III-N structure on the semiconductor substrate 136. The first set of functional blocks is coupled to a second set of functional blocks including VR 112 including a third III-N structure on the semiconductor substrate 138 and NMOS logic 120 including a fourth III-N structure on the semiconductor substrate 138. The first set of functional blocks is coupled to a switch 118 including a fifth III-N structure on the semiconductor substrate 134.

In one implementation, one of VR 112, PA 114, LNA 116, switch 118, or NMOS logic 120 includes a corresponding III-N structure on a semiconductor substrate. In another implementation, any two of VR 112, PA 114, LNA 116, switch 118, or NMOS logic 120 include a corresponding III-N structure on a common semiconductor substrate. In another implementation, any three of VR 112, PA 114, LNA 116, switch 118, or NMOS logic 120 include a corresponding III-N structure on a common semiconductor substrate. In another implementation, any four of VR 112, PA 114, LNA 116, switch 118, or NMOS logic 120 include a corresponding III-N structure on a common semiconductor substrate. In another implementation, each of VR 112, PA 114, LNA 116, switch 118, or NMOS logic 120 include a corresponding III-N structure on a common semiconductor substrate.

Figure 2A:
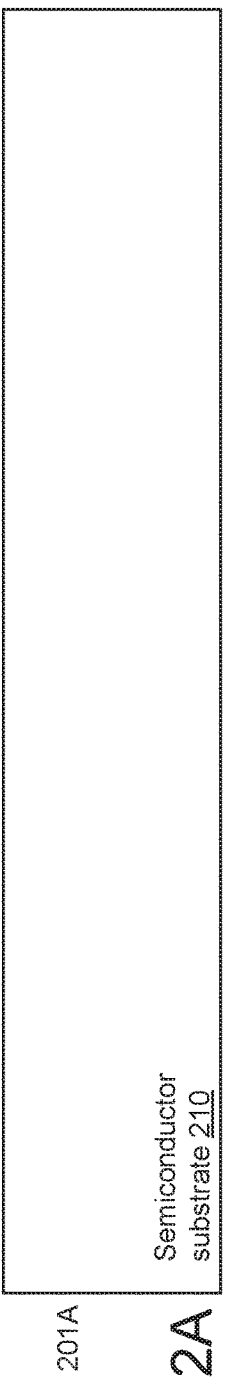
FIGS. 2A-R illustrate a fabrication process for a transistor of a III-N integrated RF front-end circuit, according to an implementation of the present disclosure.
Figure 2B:
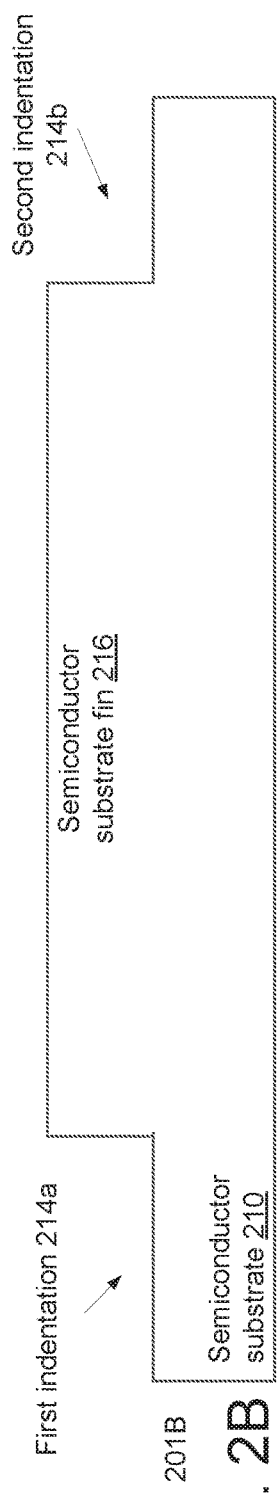
Figure 2C:
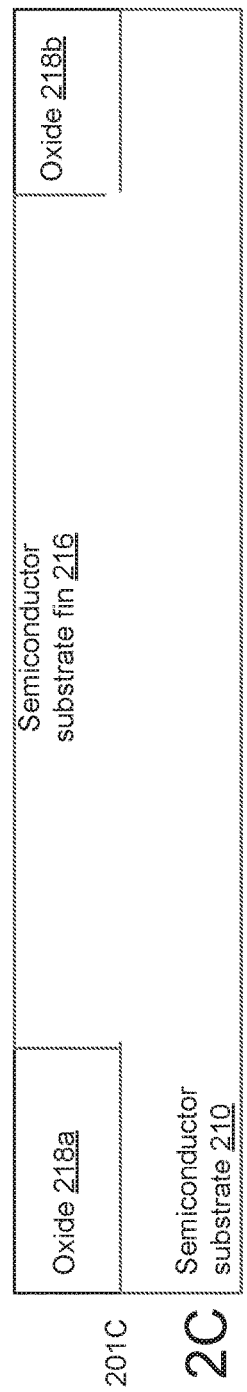
Figure 2D:
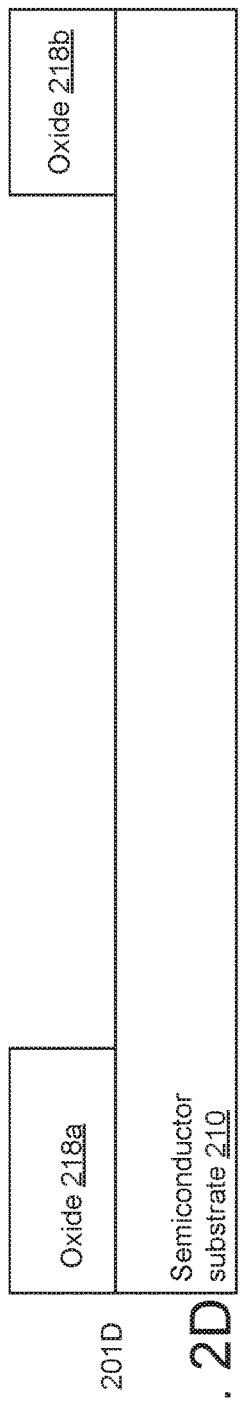
Figure 2E:
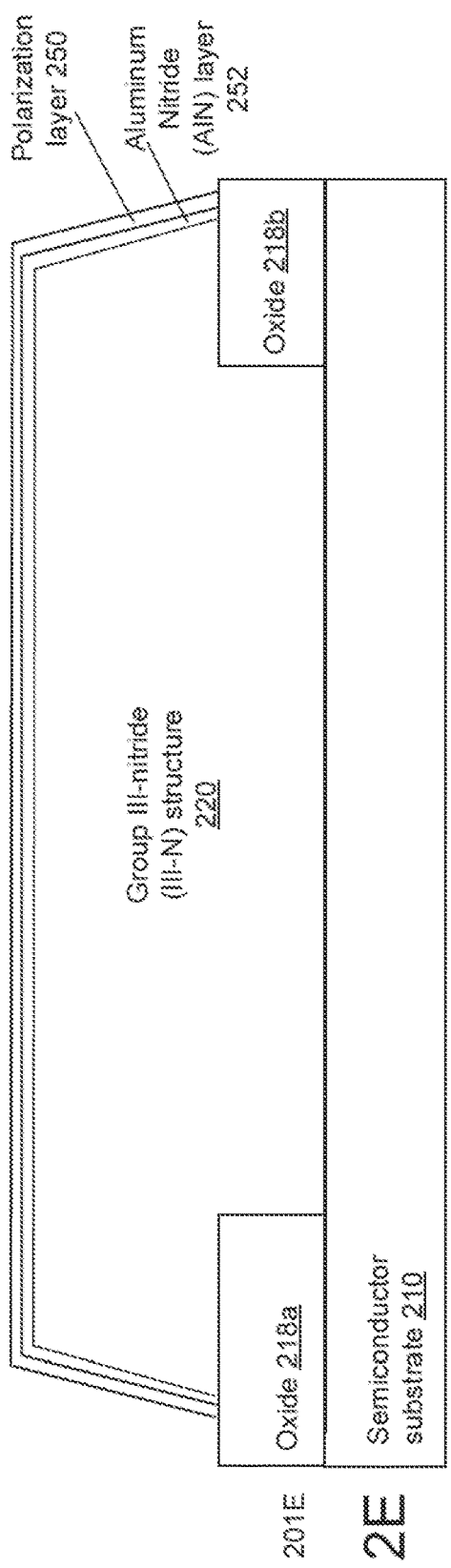
Figure 2F:
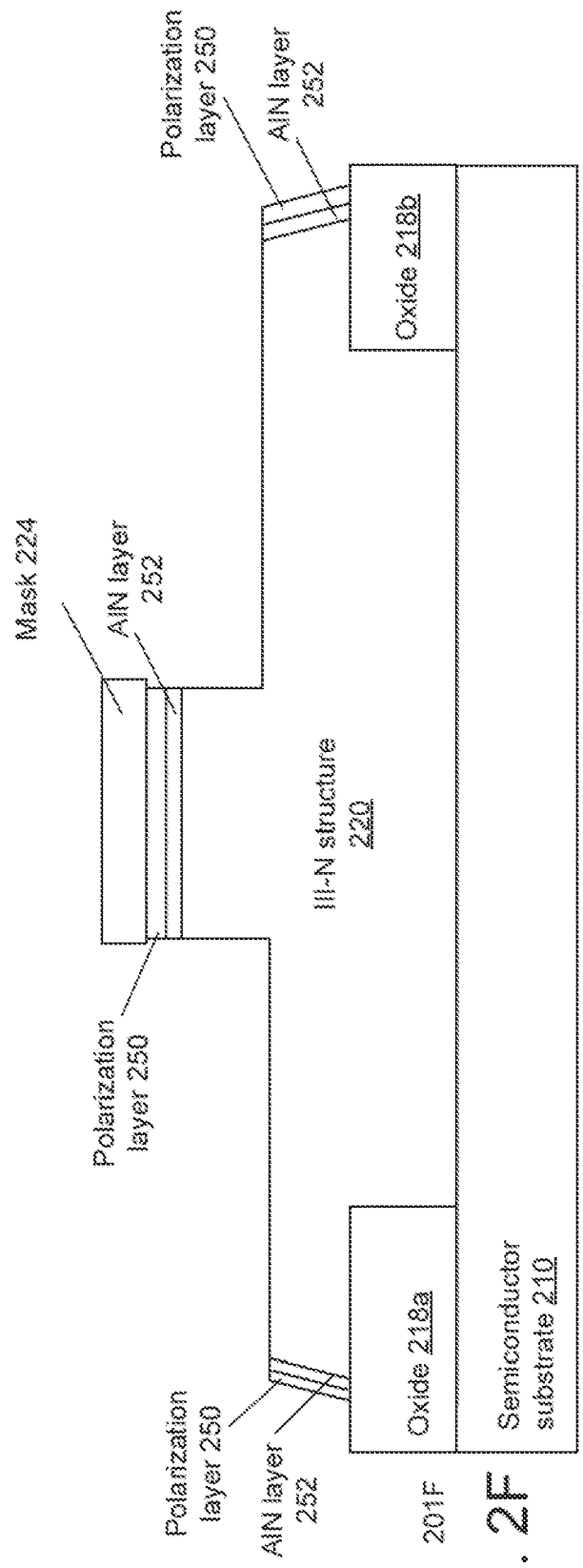
Figure 2K:
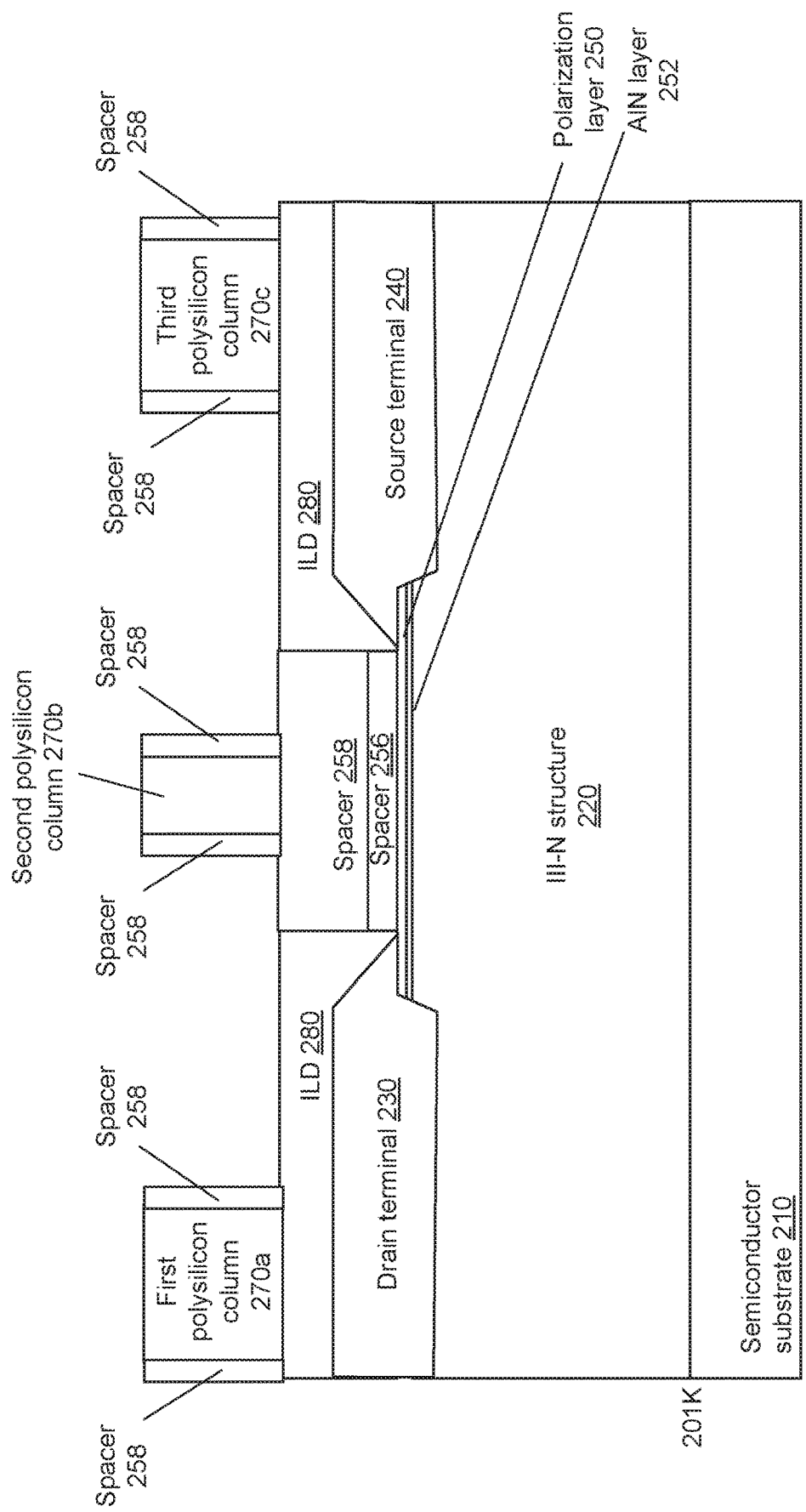
Figure 2L:
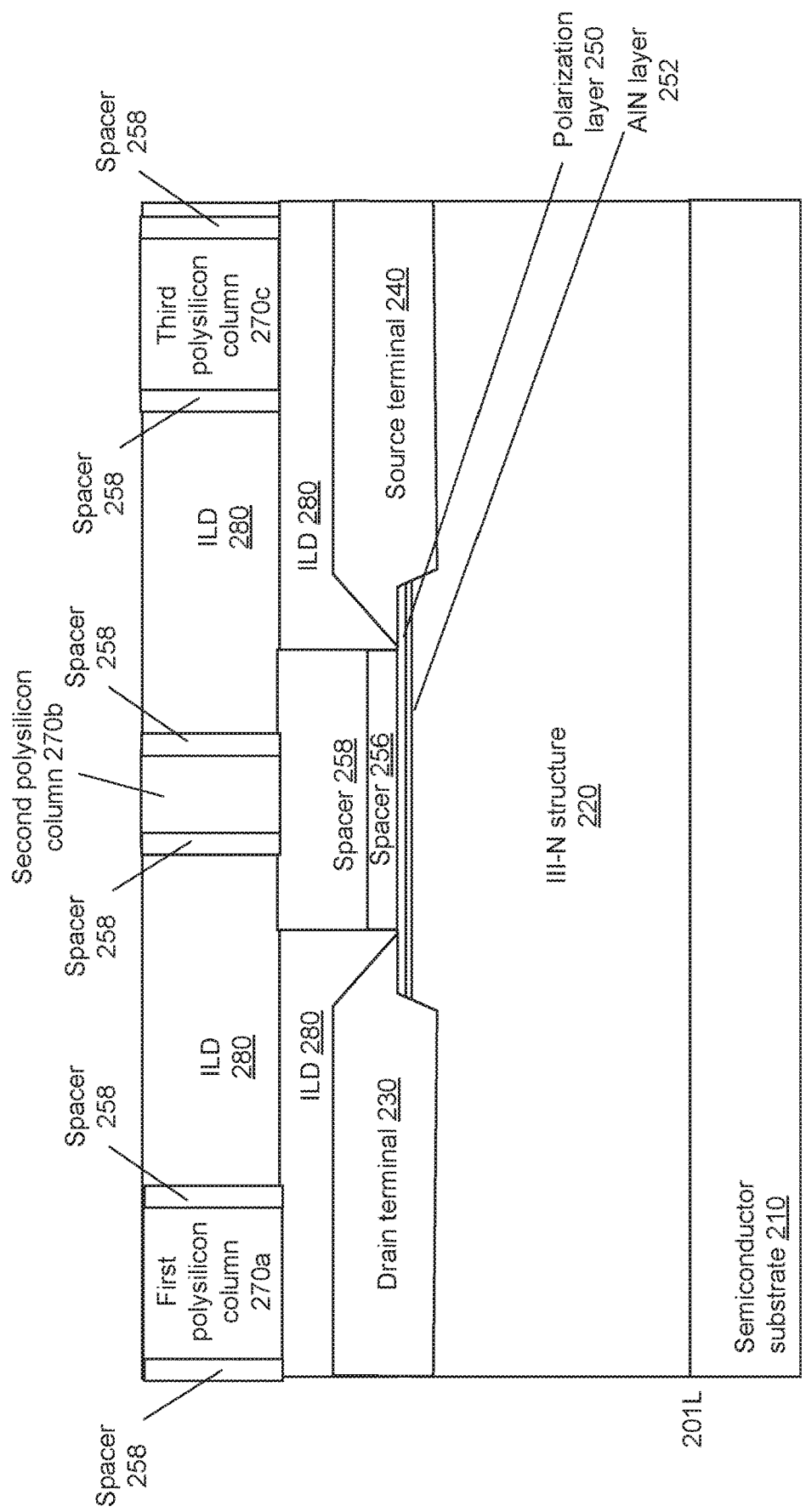
Figure 2M:
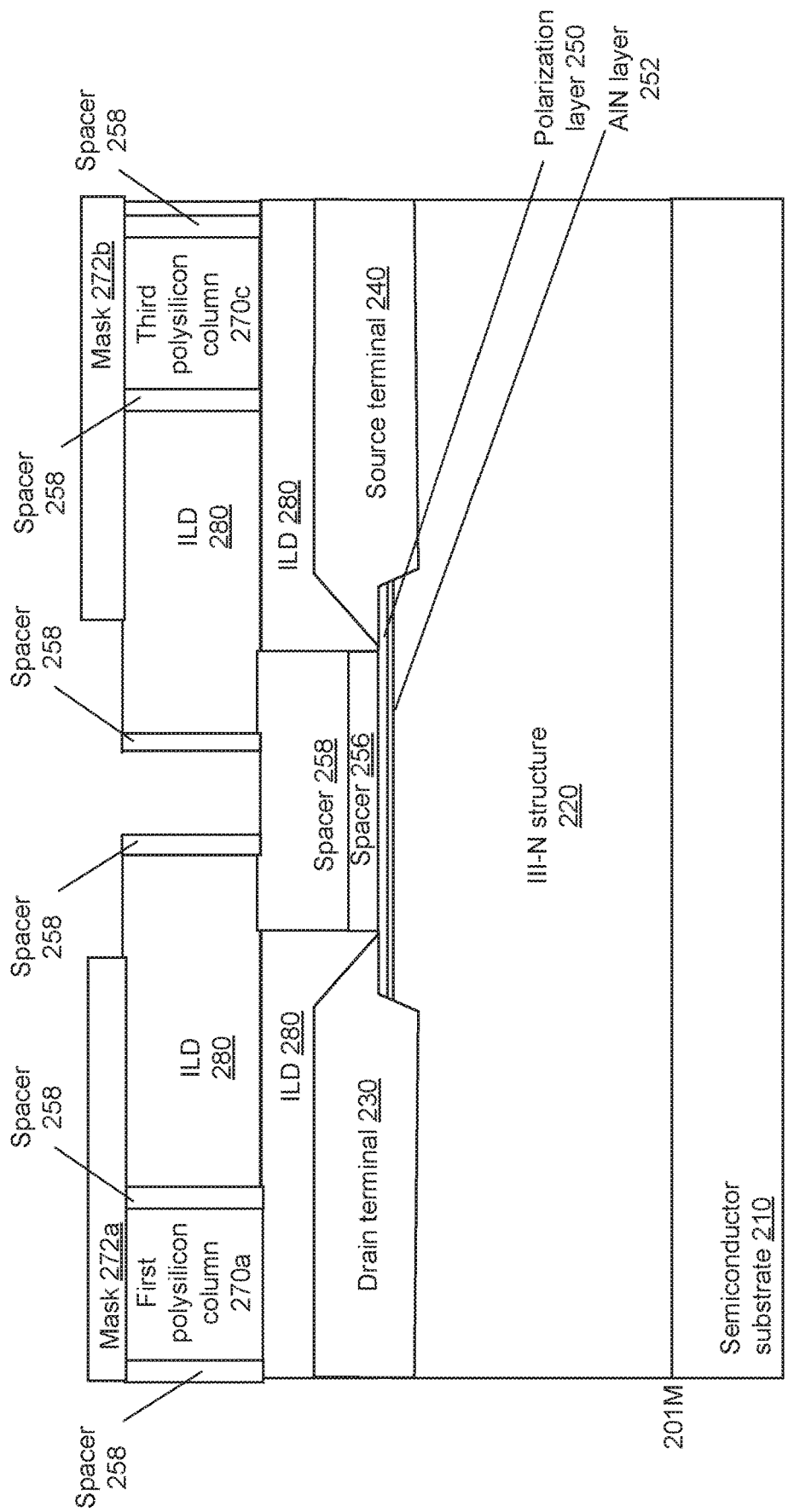
Figure 2N:
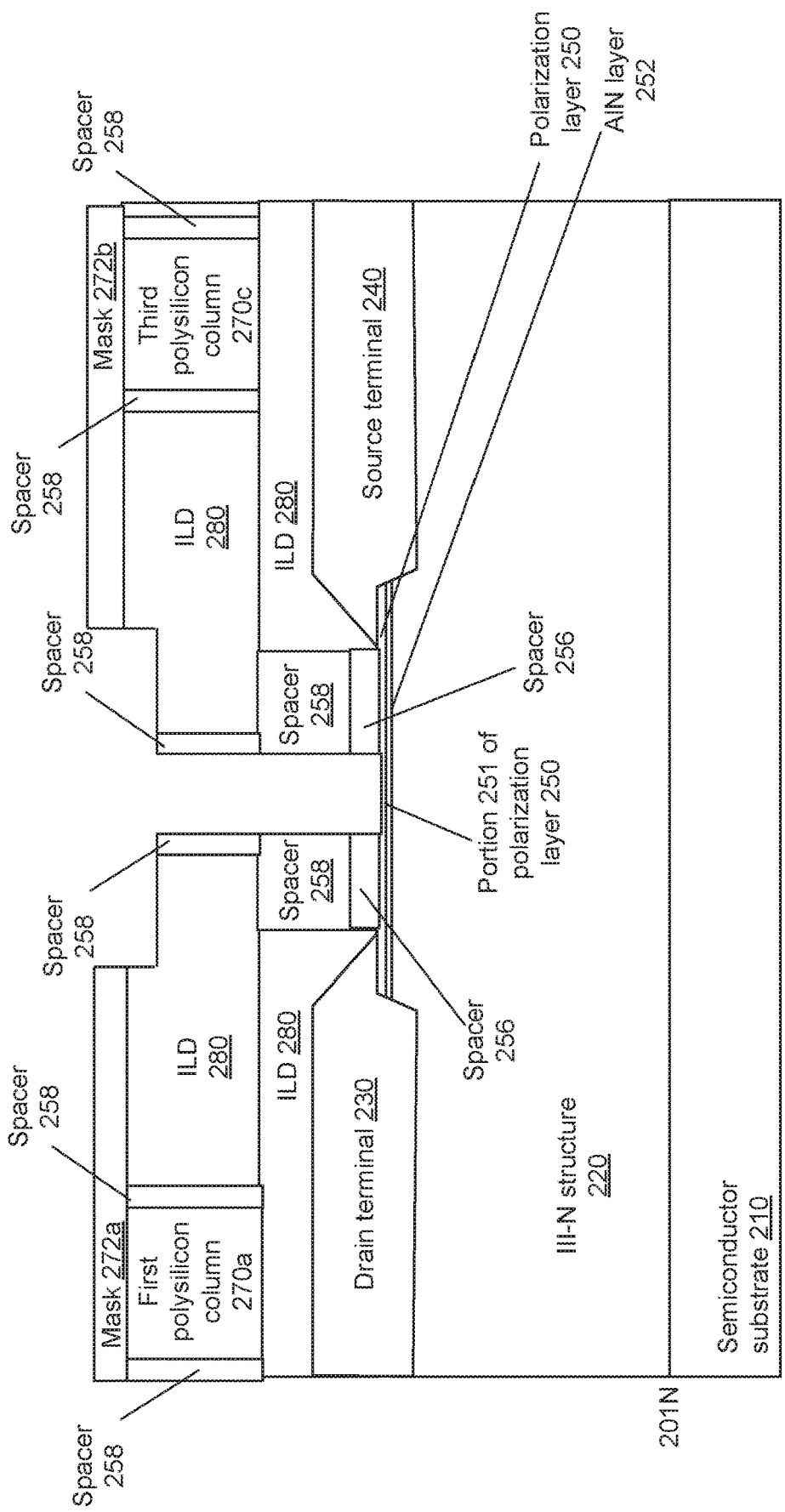
Figure 2O:
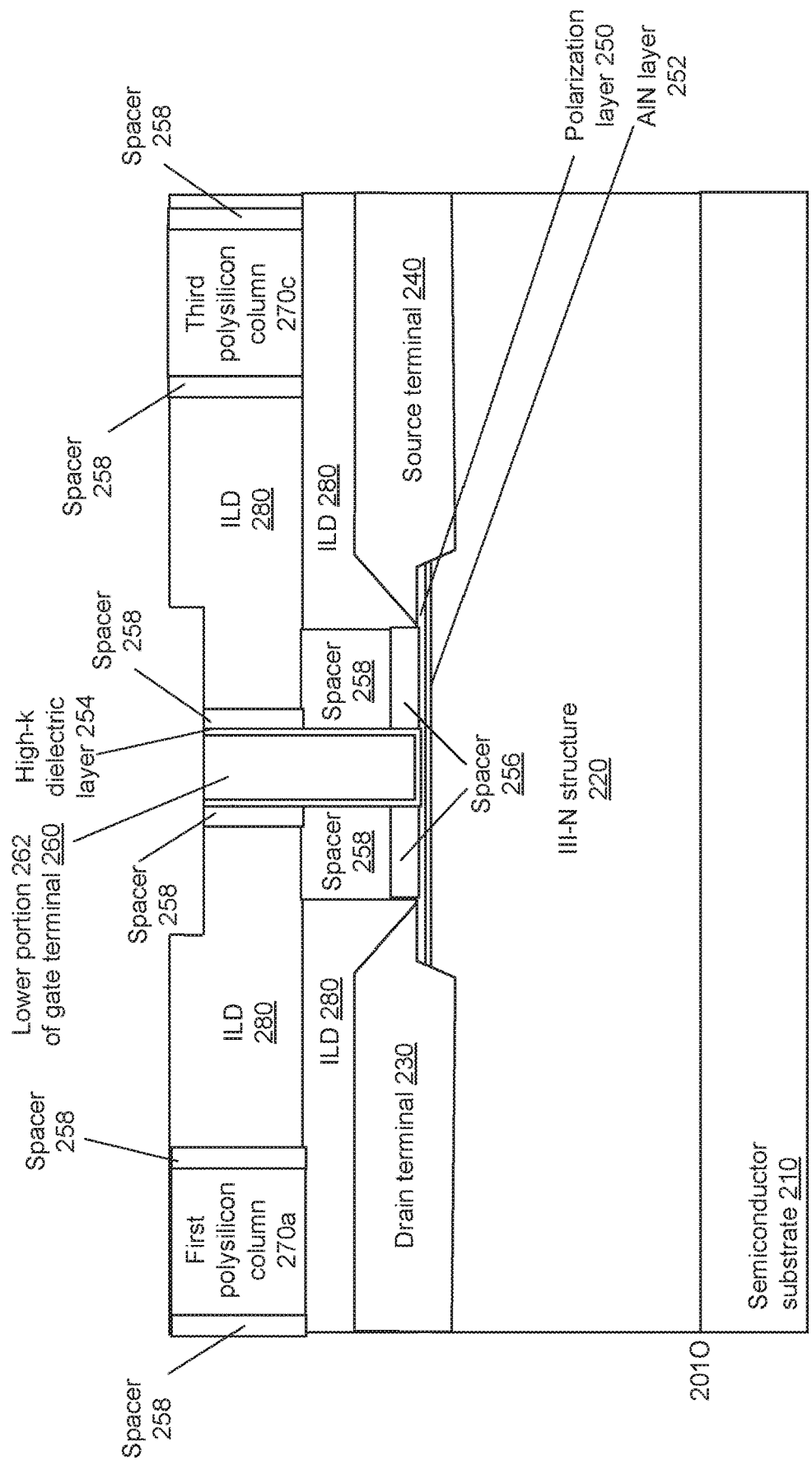
Figure 2P:
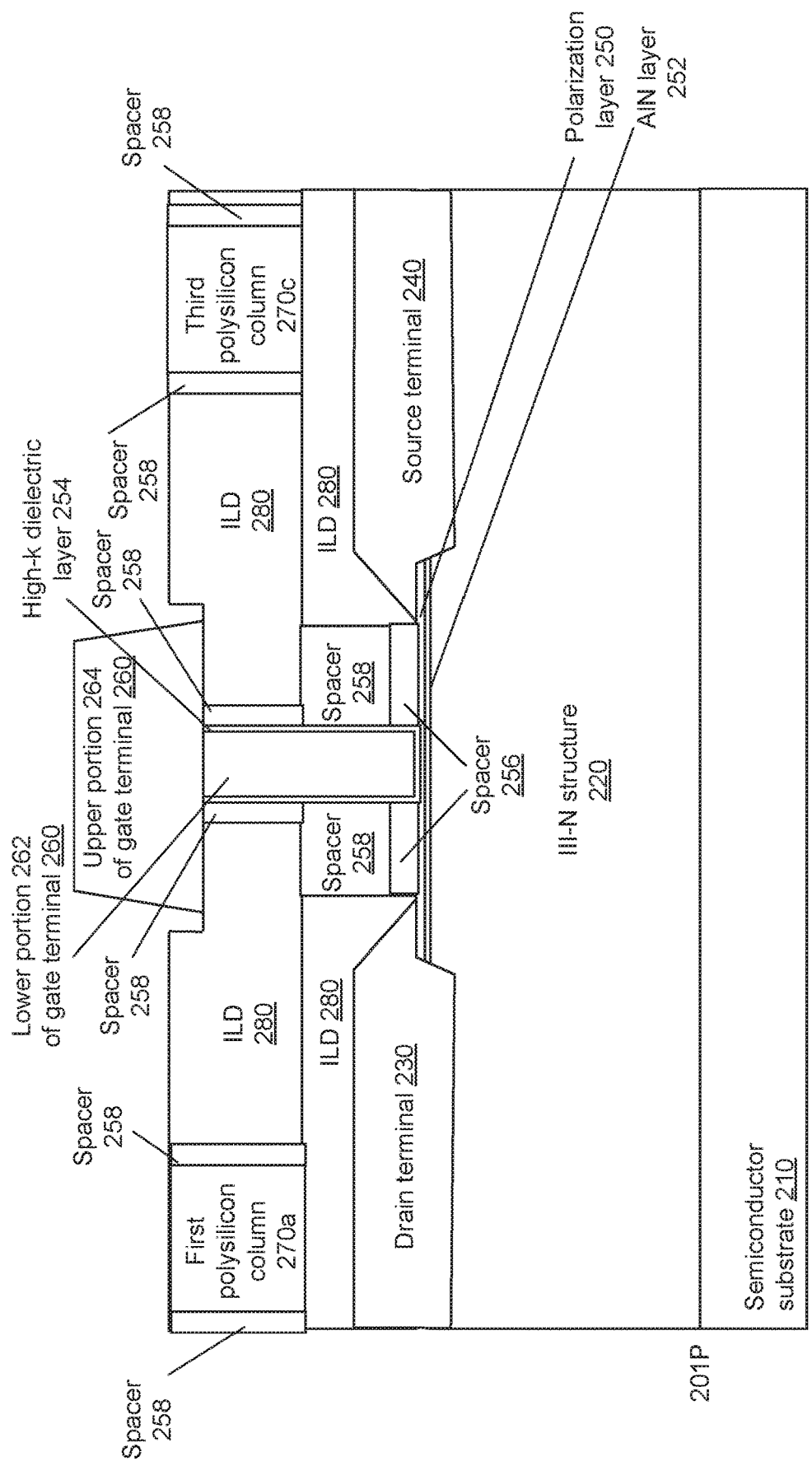
Figure 2Q:
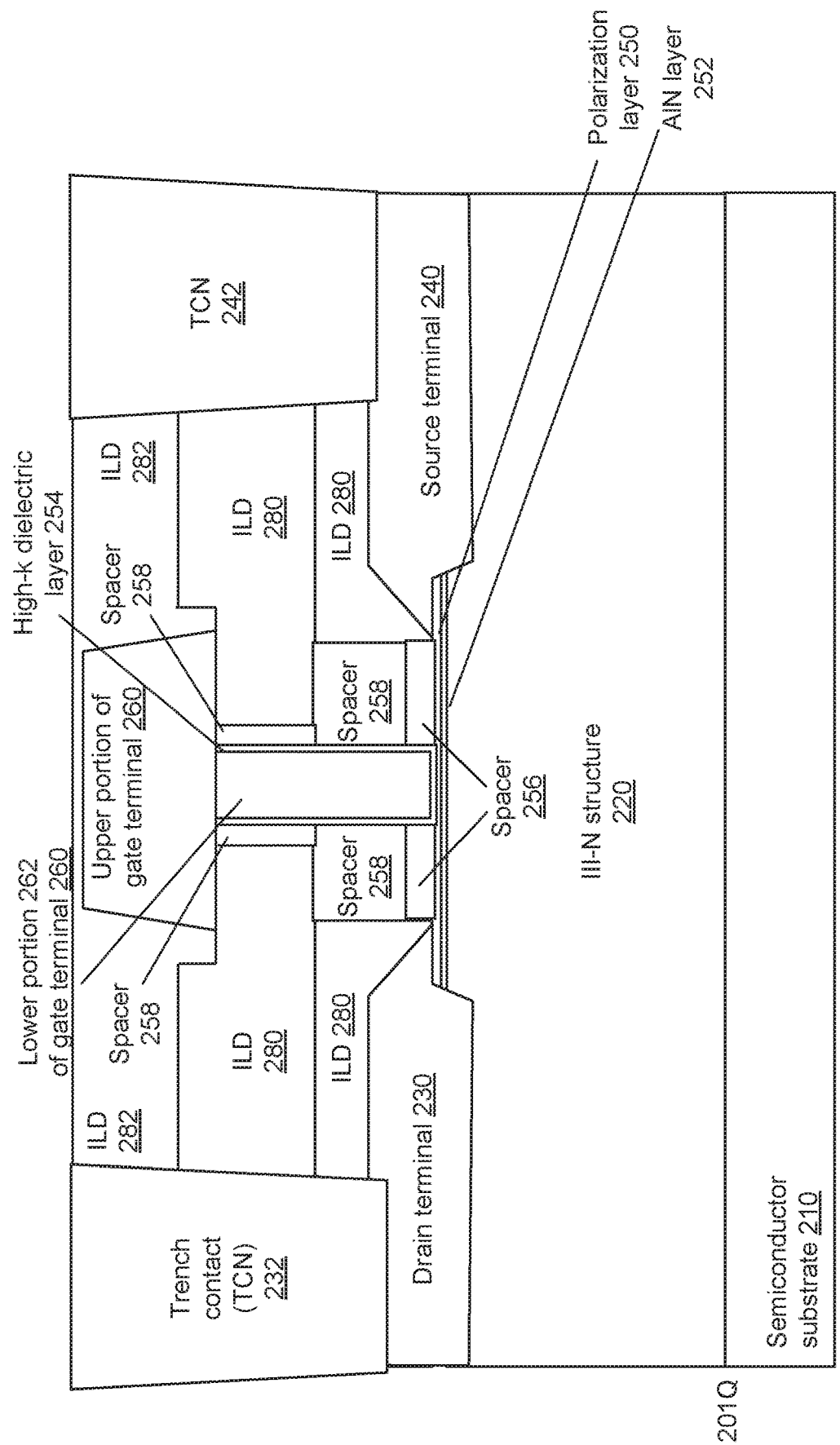
Figure 2R:
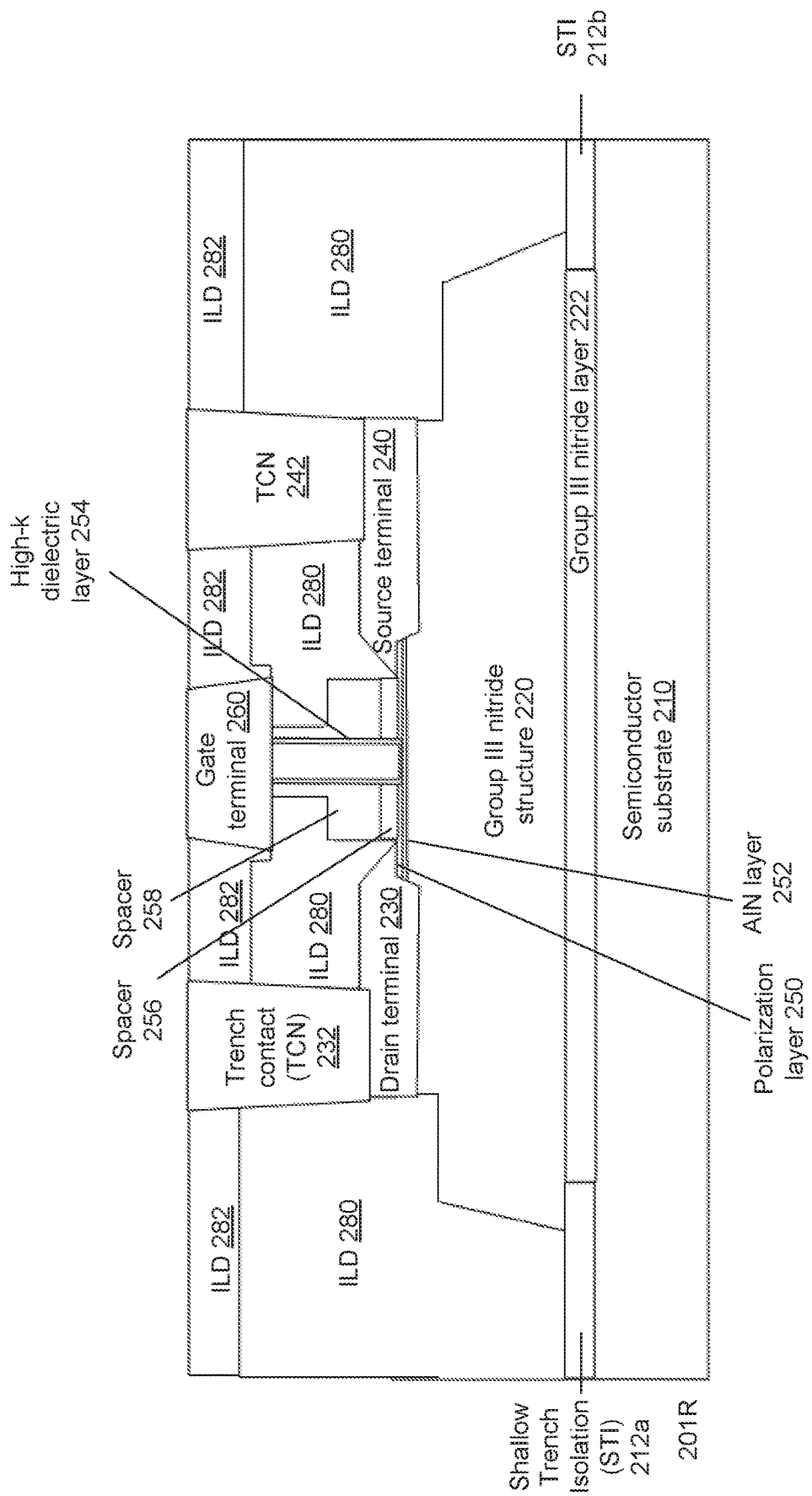

FIGS. 2A-R illustrate a fabrication process 200 for a semiconductor structure 201 (e.g., transistor) of an III-N integrated RF front-end circuit 110, according to an implementation of the present disclosure. Fabrication process 200 includes semiconductor structure 201 at various stages of the fabrication process 200, according to one exemplary implementation. It may be noted that fabrication process 200 is shown for purposes of illustration, rather than limitation. Fabrication process 200 may be performed in any order, include any number of processes, and include more, the same, or fewer processes. It may also be noted that for purposes of illustration, rather than limitation, materials are illustrated in the various layers of fabrication process 200. Other materials, other or in addition to the materials illustrated in FIGS. 2A-R, may also be used in other implementations. FIGS. 2A-R show the formation of first trench contact 232, second trench contact 242, and gate terminal 260 above the semiconductor substrate 210 of the semiconductor structure 201. It may be noted that multiple first trench contacts 232, second trench contacts 242, and gate terminals 260 may be formed on the same layer of structure 201 and on different layers of structure 201. It may be noted that the formation of a transistor of an III-N integrated RF front-end circuit 110 is described for purposes of illustration, rather than limitation. It may also be noted that processes herein, such as fabrication process 200 and method 300 of FIG. 3, may be extended to produce a first transistor of an III-N integrated RF front-end circuit 110. For example, processes for creating second transistor (e.g., on the same layer, on a different layer) of an III-N integrated RF front-end circuit 110 may be removed from fabrication process 200, in some implementations.

FIG. 2A illustrates a cross section in a first plane of structure 201A. Structure 201A illustrates a semiconductor substrate 210. Semiconductor substrate 210 may include silicon. Semiconductor substrate 210 may be a variety of materials, including, but not limited to, Sapphire, Silicon, Gallium Nitride (GaN), Germanium, or Silicon Carbide. Semiconductor substrate 210 may be silicon on insulator (SOI). In one implementation, semiconductor substrate 210 is silicon. Crystallographic orientation of a substantially monocrystalline semiconductor substrate 210 may be any of (100), (111), or (110) on the Miller Indices. Other crystallographic orientations are also possible. The crystallographic orientations of semiconductor substrate 210 may be offcut. In one implementation, semiconductor substrate 210 is (100) silicon with crystalline semiconductor substrate surface region having cubic crystallinity. In another implementation, for a (100) silicon semiconductor substrate 210, the semiconductor surface may be miscut, or offcut, for example 2-10° toward [110]. In another implementation, semiconductor substrate 210 is (111) silicon with crystalline semiconductor substrate surface region having hexagonal crystallinity.

It may be noted that a buffer layer (not shown) may be disposed between the semiconductor substrate 210 and components on the semiconductor substrate 210. An appropriate buffer layer may be disposed corresponding to the material type of semiconductor substrate 210.

FIG. 2B illustrates a cross section in the first plane of structure 201B. Structure 201B illustrates cutting the semiconductor substrate 210. In one implementation, the semiconductor substrate 210 may be fin cut. In another implementation, the semiconductor substrate may be diffusion cut. A first indentation 214a and a second indentation 214b may be cut in semiconductor substrate 210 to form a semiconductor substrate fin 216. The semiconductor substrate fin 216 may have a width of 10 micrometers (μm) and a height of 200 nanometers (nm).

FIG. 2C illustrates a cross section in the first plane of structure 201C. Structure 201C illustrates depositing oxide 218a in the first indentation 214a and oxide 218b in the second indentation 214b. In one implementation, oxide 218a and oxide 218b are silicon dioxide ($SiO_2$). Oxide 218a and 218b may be shallow trench isolations and may undergo planarization.

FIG. 2D illustrates a cross section in the first plane of structure 201D. Structure 201D illustrates removing the semiconductor substrate fin 216 from semiconductor substrate 210 (e.g., fin etchout). In one implementation, the semiconductor substrate fin 216 is removed between the oxide 218a and oxide 218b to be substantially planar with the first indentation 214a and the second indentation 214b.

FIG. 2E illustrates a cross section in the first plane of structure 201E. Structure 201E illustrates forming a III-N structure 220 (e.g., III-N island, III-N discrete structure) on the semiconductor substrate 210, oxide 218a, and oxide 218b. The III-N structure 220 may be grown on the semiconductor substrate 210 in a reactor. In some implementations, the one or more III-N structures 220 are grown directly on the semiconductor substrate 210 in a reactor. The III-N structure 220 may be separated by one or more shallow trench isolations (STI) 420 from other III-N structures 220 (see FIG. 4). The III-N structure 220 may be selectively grown to 0.05 microns to about 10 microns. Structure 201E also illustrates forming a polarization layer 250 above the III-N structure 220 (e.g., above an upper surface and sidewalls of the III-N structure 220). The polarization layer 250 may be 5 to 15 nm in height. The polarization layer 250 may be a thin sheet of electron gas (e.g., two-dimension electron gas (2DEG) layer). The polarization layer 250 may provide doping of the III-N structure 220. In one implementation, an AlN layer 252 (1 nm height) may be formed on the III-N structure 220 and the polarization layer 250 (e.g., InAlN polarization layer) may be formed on the AlN layer 252. The width of the III-N structure 220 between the oxide 218a and oxide 218b may be about 25 μm. The height of the III-N structure 220 from the upper surface of oxide 218a to the upper surface of the III-N structure 220 may be 2 μm.

FIG. 2F illustrates a cross section in the first plane of structure 201F. Structure 201F illustrates forming a mask 224 on the polarization layer 250 above a portion of the semiconductor substrate 210 between the oxide 218a and oxide 218b and removing portions of the III-N structure 220, AlN layer 252, and polarization layer 250 that are not under the mask 224 (e.g., fin or diffusion cut).

FIG. 2G illustrates a cross section in the first plane of structure 201G. Structure 201G illustrates removing further portions of the III-N structure 220, AlN layer 252, and polarization layer 250 that are not under the mask 224 to be substantially the same height as the oxide 218a (e.g., 200 nm). The mask 224 is removed and a planarization oxide 228 is formed on the first oxide 218a, III-N structure 220, and the second oxide 218b (e.g., STI oxide fill and polish).

FIG. 2H illustrates a cross section in a second plane 229 (e.g., perpendicular to the first plane; see FIG. 2G) of structure 201H. Structure 201H illustrates a zoomed-in view of semiconductor substrate 210, III-N structure 220, AlN layer 252, and polarization layer 250.

FIG. 2I illustrates a cross section in the second plane of structure 201I. Structure 201I illustrates forming a first spacer 256 on the polarization layer 250, and forming a second spacer 258 on the first spacer 256. The first spacer 256 may be an oxide (e.g., silicon oxide, silicon oxynitride, etc.). The second spacer 258 may be a nitride (e.g., silicon nitride, etc.).

FIG. 2J illustrates a cross section in the second plane of structure 201J. Structure 201J illustrates removing a first portion and a second portion of the III-N structure 220, polarization layer 250, and AlN layer 252, and forming (e.g., growing) a drain terminal 230 and a source terminal 240 on the III-N structure 220. An inter-layer dielectric (ILD) 280 (e.g., an oxide) is formed on the drain terminal 230, the first spacer 256, the second spacer 258, and the source terminal 240 (e.g., oxide fill and polish).

FIG. 2K illustrates a cross section in the second plane of structure 201K. Structure 201K illustrates forming a first polysilicon column 270a above the drain terminal 230, a second polysilicon column 270b above the polarization layer 250, and a third polysilicon column 270c above the source terminal 240. Each polysilicon column 270 may be one or more of a gate dummy, a dummy poly, etc. The first polysilicon column 270a and third polysilicon column 270c are formed on the ILD 280. Spacer 258 (e.g., silicon nitride) is formed on the sidewalls of each of the polysilicon columns 270. The height of each of the polysilicon columns 270 may be about 50 nm.

FIG. 2L illustrates a cross section in the second plane of structure 201L. Structure 201L illustrates forming ILD 280 on the ILD 280 and the spacer 258 (e.g., spacer 258 on the spacer 256, spacer 258 on the sidewall of polysilicon column 270) (e.g., planarizing).

FIG. 2M illustrates a cross section in the second plane of structure 201M. Structure 201M illustrates removing the second polysilicon column 270b, forming a mask 272a above the drain terminal 230 (e.g., on the first polysilicon column 270a, the spacer 258 on the sidewalls of the first polysilicon column 270a, and the ILD 280), and forming a mask 272b above the source terminal 240 (e.g., on the third polysilicon column 270c, the spacer 258 on the sidewalls of the third polysilicon column 270c, and the ILD 280). The mask 272 may be a nitride or oxide mask FIG. 2N illustrates a cross section in the second plane of structure 201N. Structure 201N illustrates removing a portion of the ILD 280 and spacer 258 that is not blocked by mask 272a or mask 272b (e.g., the portion of the ILD 280 and spacer 258 between masks 272a and 272b, recess etching). Structure 201N further illustrates removing a portion of spacer 258 and spacer 256 below where the second polysilicon column 270b was located (e.g., polarization layer 250 etch). A portion 251 of the polarization layer 250 below where the second polysilicon column 270b was located may be removed. The thickness of the portion 251 of the polarization layer 250 defines the threshold voltage of the transistor. Etching deeper into the portion 251 of polarization layer 250 (e.g., a thinner portion 251 of polarization layer 250), results in a higher threshold voltage of the transistor formed by structure 201. The portion 251 is originally about 5-15 nm. In some implementations, after etching, the portion 251 has a thickness of about 1-2 nm (e.g., a portion 251 corresponding to a first transistor has a 1 nm thickness and a portion 251 corresponding to a second transistor has a 2 nm thickness, etc.). In other implementations, through etching, the portion 251 is completely removed and the AlN layer 252 serves as an etch stop. Different transistors of different thresholds (e.g., different thicknesses of portion 251 of polarization layer 250) may be integrated in a III-N integrated RF front-end circuit 110.

FIG. 2O illustrates a cross section in the second plane of structure 201O. Structure 201O illustrates forming a high-k dielectric layer 254 on the polarization layer 250, the first spacer 256, and the second spacer 258 (where the second polysilicon column 270b was located and below the polysilicon column 270b) and forming a lower portion 262 (e.g., gate foot) of the gate terminal 260 on the high-k dielectric layer 254. The lower portion 262 of gate terminal 260 may be titanium nitride or nickel and the upper surface of the lower portion 262 may be polished. The high-k dielectric layer 254 may be a material with a high dielectric constant k (κ) as compared to silicon dioxide (e.g., high-k dielectric layer 254 may have a dielectric constant greater than 3.9 (the dielectric constant of silicon dioxide)).

FIG. 2P illustrates a cross section in the second plane of structure 201P. Structure 201P illustrates forming an upper portion 264 of the gate terminal 260 on the lower portion 262 of the gate terminal 260 and on the ILD 280. The height of the lower portion 262 may be about 100 nm. The distance from the sidewall of the lower portion 262 to the edge of the upper portion 264 of the gate terminal 260 may be about 25 nm. The upper portion 264 may be tungsten and may be etched to provide the shape of the upper portion 264 (e.g., sloped sidewalls at a predefined angle, a level upper surface at a predefined height, etc.).

FIG. 2Q illustrates a cross section in the second plane of structure 201Q. Structure 201Q illustrates removing the first polysilicon column 270a, spacer 258 surrounding the first polysilicon column 270a, ILD 280 below the first polysilicon column 270a and surrounding spacer 258, and a portion of the drain terminal 230 below the first polysilicon column 270a and surrounding spacer 258. Structure 201Q further illustrates forming a trench contact 232 on the drain terminal 230 where the first polysilicon column 270a and surrounding spacer 258 and ILD 280 were removed. Structure 201Q further illustrates removing the third polysilicon column 270c, spacer 258 surrounding the third polysilicon column 270c, ILD 280 below the third polysilicon column 270c and surrounding spacer 258, and a portion of the source terminal 240 below the third polysilicon column 270c and surrounding spacer 258. Structure 201Q further illustrates forming a trench contact 242 on the source terminal 240 where the third polysilicon column 270c and surrounding spacer 258 and ILD 280 were removed. Trench contact 232 and trench contact 242 may be tungsten. The inner sidewall of each of trench contact 232 and 242 may be 50 to 500 nm from the sidewall of the upper portion 264 of gate terminal 260. Structure 201Q further illustrates forming ILD 282 on ILD 280, sidewalls of trench contact 232, sidewalls of trench contact 242, and on the sidewalls and upper surface of the upper portion 264 of the gate terminal 260.

FIG. 2R illustrates a cross-section in the second plane of structure 201R. FIG. 2R may be a zoomed out view compared to the views shown in FIGS. 2H-Q. Structure 201R is a transistor of the III-N integrated RF front-end circuit 110. The components of the transistor may enable the integration of the functional blocks of the III-N integrated RF front-end circuit 110 on a single silicon chip (see FIGS. 1A-C and FIG. 4).

Structure 201R includes a semiconductor substrate 210, a III-N structure 220 above the semiconductor substrate, a drain terminal 230 and a source terminal 240 on the III-N structure 220, a polarization layer 250 above the III-N structure between the drain terminal 230 and the source terminal 240, and a gate terminal 260 above the polarization layer 250.

In some implementations, the structure 201R includes a first trench contact 232 on the drain terminal 230 and a second trench contact 242 on the source terminal. The structure 201R includes an AlN layer 252 on the III-N structure 220 between the drain terminal 230 and the source terminal 240, where the polarization layer 250 is on the AlN layer 252. The structure 201R includes a high-k dielectric layer 254. The gate terminal 260 is a t-shape and includes a lower portion 262 and an upper portion 264. A first portion of the high-k dielectric layer 254 is on the lower surface of the lower portion 262 of the gate terminal 260. A second portion of the high-k dielectric layer 254 is on sidewalls of the lower portion 262 of the gate terminal 260. The polarization layer 250 is between the AlN layer 252 and the first portion of the high-k dielectric layer 254.

In some implementations, the structure 201R includes a first shallow trench isolation (STI) 212a and a second STI 212b on the semiconductor substrate 210. STI 212a and STI 212b may be an oxide. The structure 201R may include a first layer of III-N 222 on the semiconductor substrate 210 between the first STI 212a and the second STI 212b. The III-N structure 220 is on the first layer of III-N 222.

In some implementations, the structure 201R includes a first spacer 256 on the polarization layer 250 and the second portion of the high-k dielectric layer 254. The structure 201R may include a second spacer 258 on the first spacer 256 and on the second portion of the high-k dielectric layer 254. The structure 201R may include a first inter-layer dielectric (ILD) 280 on the first STI 212a, the second STI 212b, the III-N structure 220, the drain terminal 230, the source terminal 240, the first trench contact 232, first spacer 256, the second spacer 258, a lower surface of the upper portion 264 of the gate terminal 260, and the second trench contact 242. The structure 201R may include a second ILD 282 on the first ILD 280, the first trench contact 232, sidewalls of the upper portion 264 of the gate terminal 260, and the second trench contact 242.

In one implementation, the semiconductor substrate is a silicon (Si) (111) structure. In another implementation, the semiconductor substrate is a Si (110) structure. In another implementation, the semiconductor substrate is a Si (100) structure. In some implementations, the first STI and the second STI are a first oxide.

In one implementation, the III-N structure 220 and first layer of III-N 222 are GaN. In another implementation, the III-N structure 220 and first layer of III-N 222 are AN. In another implementation, the III-N structure 220 and first layer of III-N 222 are AlInN. In another implementation, the III-N structure 220 and first layer of III-N 222 are AlGaN.

In one implementation, the polarization layer 250 is AlInN. In another implementation, the polarization layer 250 is AlGaN. In another implementation, the polarization layer 250 includes AlInN and AlGaN (e.g., is a combination of AlInN and AlGaN).

In one implementation, the first spacer 256 is a silicon oxide and the second spacer 258 is a silicon nitride. In one implementation, the first ILD 280 is an oxide. The second ILD 282 may be an oxide different from the oxide of the first ILD 280.

The source terminal 240 may include indium gallium nitride (InGaN) and n-type doping. The drain terminal 230 may include InGaN and n-type doping.

Figure 3:
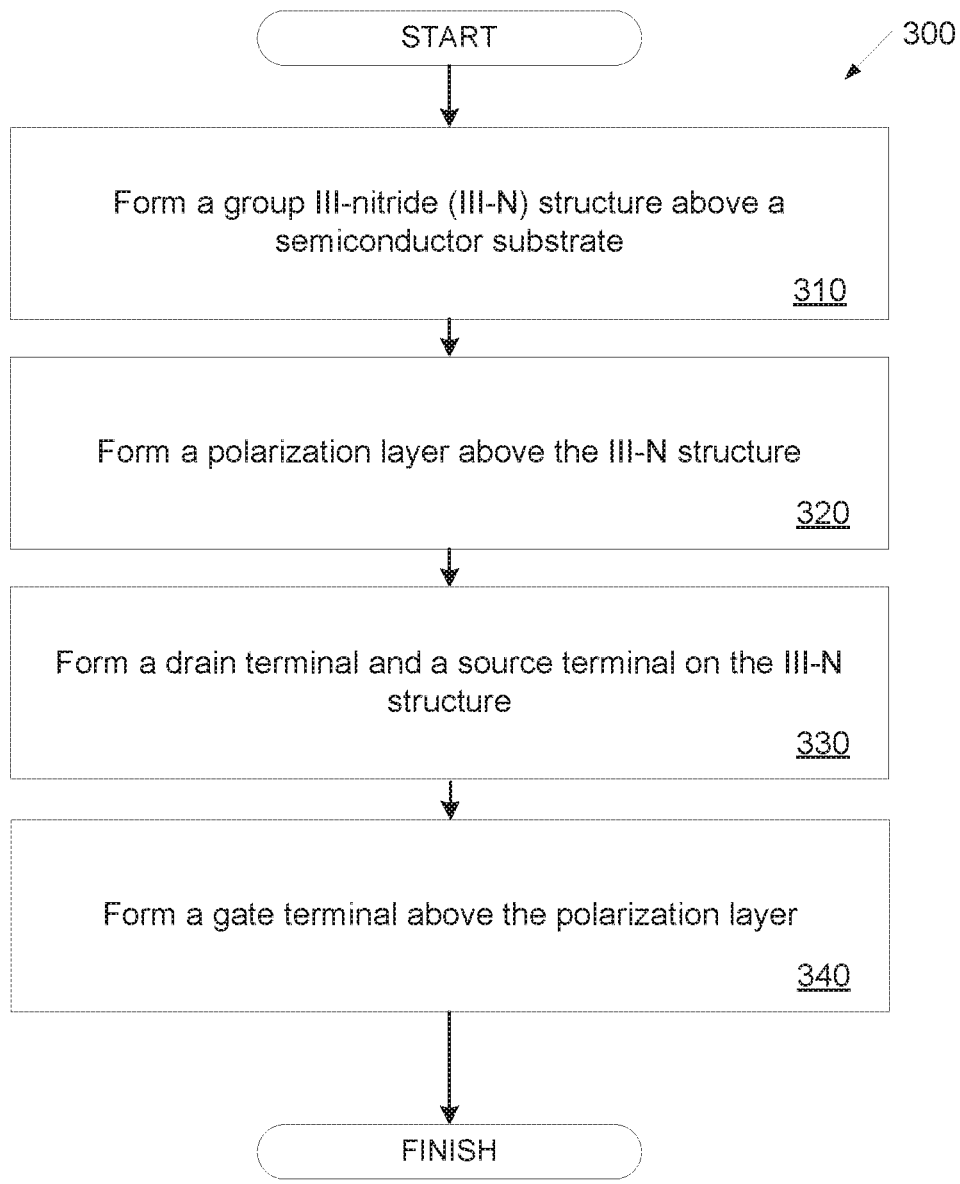
FIG. 3 illustrates a process flow for fabricating a III-N integrated RF front-end circuit, according to an implementation of the present disclosure.

FIG. 3 illustrates a process flow for fabricating a transistor of a III-N integrated RF front-end circuit 110, according to another implementation. It may be noted that features of FIGS. 2A-R may be described below to help illustrate method 300. Method 300 may be performed as operations. It may be noted that method 300 may be performed in any order and may include the same, more, or fewer operations. It may be noted that method 300 may be performed by one or more pieces of semiconductor fabrication equipment or fabrication tools.

Method 300 begins at operation 310 that forms a III-N structure 220 above a semiconductor substrate 210. In some implementations, the method 300 may further include forming a first shallow trench isolation (STI) 212a and a second STI 212b on the semiconductor substrate 210, forming a first layer of III-N 222 on the semiconductor substrate 110 between the first STI 212a and the second STI 212b, where the III-N structure 220 is formed on the first layer of III-N 222. Operation 310 may be further described with respect to structures 201A-E of FIGS. 2A-E.

At operation 320, a polarization layer 250 is formed above the III-N structure 220. Operation 320 may be further described with respect to structures 201E-201N of FIGS. 2E-N. In some implementations, operation 320 further includes forming an AlN layer 252 on the III-N structure 220 between the source terminal 240 and the drain terminal 230 (see FIGS. 2E-Q), where the polarization layer 250 is formed on the AlN layer 252.

At operation 330, a drain terminal 230 and a source terminal 240 are formed on the III-N structure 220. The polarization layer 250 is between the drain terminal 230 and the source terminal 240. Operation 330 may be further described with respect to structure 201J of FIG. 2J. In some implementations, the method 300 may further include forming a first trench contact 232 on the drain terminal 230 and a second trench contact 242 on the source terminal 240 (see FIGS. 2K-Q).

At operation 340, a gate terminal 260 is formed above the polarization layer 250. Operation 340 may be further described with respect to structures 201O-201P of FIGS. 2O-P. The gate terminal 260 may include a lower portion 262 and an upper portion 264 (e.g., gate terminal may be a t-shape). A first portion of a high-k dielectric layer 254 may be formed on the lower surface of the lower portion 262 of the gate terminal 260 and a second portion of the high-k dielectric layer 254 may be formed on sidewalls of the lower portion 262 of the gate terminal 260 (see FIG. 2O). The polarization layer 250 is between the AlN layer 252 and the first portion of the high-k dielectric layer 254.

In some implementations, the method 300 may further include disposing a first spacer on the polarization layer and the second portion of the high-k dielectric layer (see FIGS. 2I-O) and disposing a second spacer on the first spacer and on the second portion of the high-k dielectric layer (see FIGS. 2I-O). The method 300 may further include disposing a first inter-layer dielectric (ILD) 280 on the first STI 212a, the second STI 212b, the III-N structure 220, the drain terminal 230, the source terminal 240, the first trench contact 232, first spacer 256, the second spacer 258, a lower surface of the upper portion 264 of the gate terminal 260, and the second trench contact 242 (see FIGS. 2J-P). The method 300 may further include disposing a second ILD 282 on the first ILD 280, the first trench contact 232, sidewalls of the upper portion 264 of the gate terminal 260, and the second trench contact 242 (see FIG. 2Q).

Additional details of method 300 may be described at least with respect to FIG. 2A-R.

Figure 4:
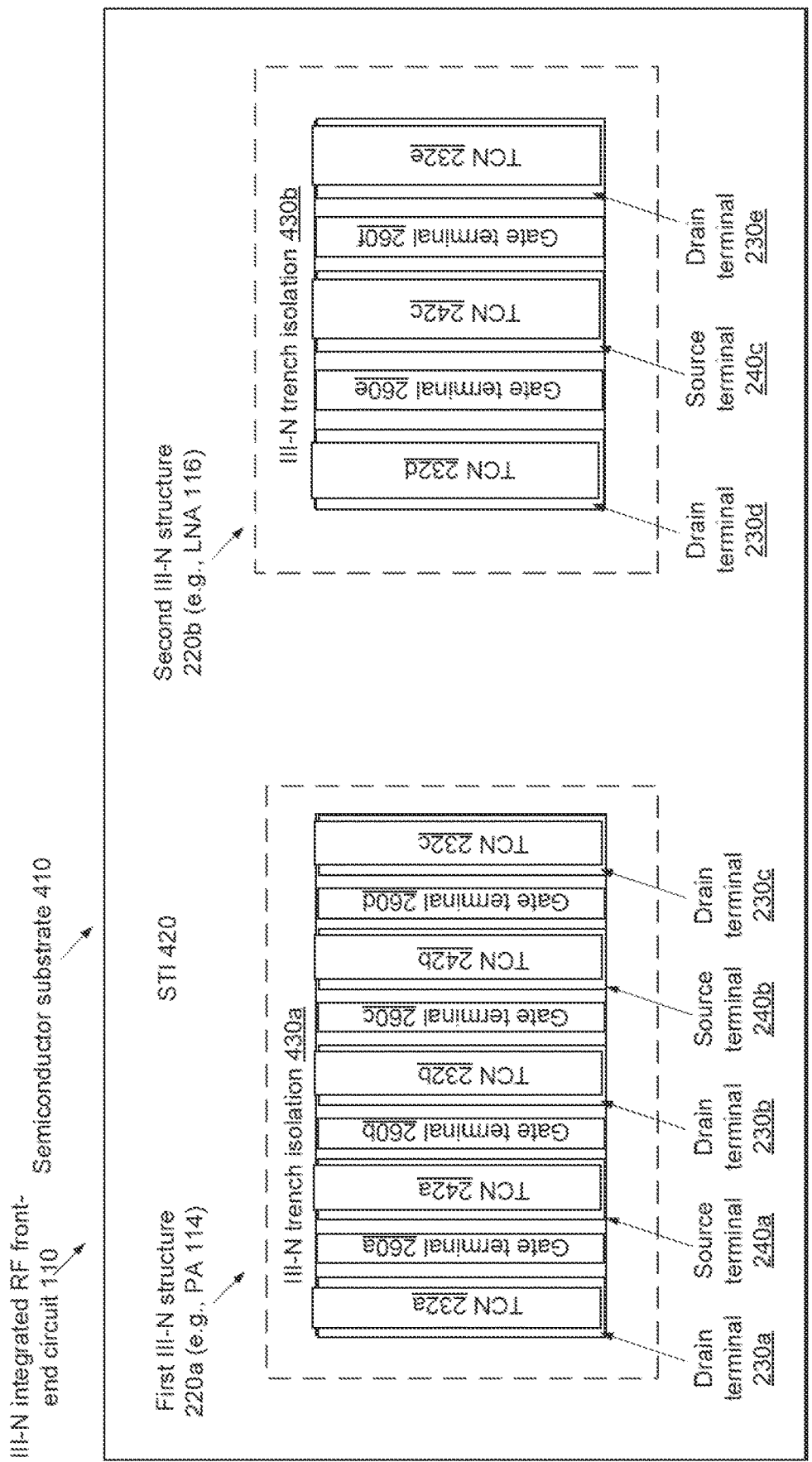
FIG. 4 illustrates a III-N integrated RF front-end circuit including a functional blocks, according to an implementation of the present disclosure.

FIG. 4 illustrates a III-N integrated RF front-end circuit 110 including functional blocks, according to an implementation of the present disclosure. The III-N integrated RF front-end circuit 110 may include a semiconductor substrate 410 (e.g., semiconductor substrate 130 of FIG. 1A, semiconductor substrate 136 of FIG. 1C, semiconductor substrate 210 of FIGS. 2A-R, etc.) and two or more functional blocks (e.g., VR 112, PA 114, LNA 116, switch 118, NMOS logic 120). Each of the functional blocks may include a III-N structure 220 on the semiconductor substrate 410. In one implementation, the III-N integrated RF front-end circuit 110 may also include an interface to be coupled to an antenna.

FIG. 4 illustrates III-N integrated RF front-end circuit 110 including a first functional block including first III-N structure 220a and a second functional block including a III-N structure 220b. First III-N structure 220a and second III-N structure 220b are discrete structures (e.g., separate structures, islands) on the semiconductor substrate. The III-N integrated RF front-end circuit 110 may include more or less functional blocks and more or less III-N structures 220. In one implementation, the III-N structures 220 are surrounded by STI 420 (e.g., STI 212a and STI 212b of FIG. 2R, oxide 218a and 218b of FIGS. 2C-G, planarization oxide 228 of FIG. 2G, an oxide, etc.). The STI 420 may be on the semiconductor substrate 410 between the III-N structures 220. In one implementation, the STI 420 may be on the semiconductor substrate partially under the III-N structures 220 (e.g., STI 212a and 212b of FIG. 2R). In one implementation, a III-N trench isolation 430 (e.g., portions of the ILD 282 of FIG. 2R, ILD 280 of FIG. 2R, and/or planarization oxide 228 of FIG. 2G that are above the III-N structure 220, an oxide, the same material as STI 420, etc.).

Each functional block may include a III-N structure 220 above the semiconductor substrate 410, source terminals 240 on the III-N structure 220, drain terminals 230 on the III-N structure 220, and gate terminals 260 above the III-N structure 220. Each of the gate terminals 260 is between a source terminal 240 and a drain terminal 230. For example, first III-N structure 220a (e.g., PA 114) includes three drain terminals 230 (230a-c), two source terminals 240 (240a-b), and four gate terminals 260 (260a-d). A corresponding TCN 232 may be formed on each drain terminal 230 and a corresponding TCN 242 may be formed on each source terminal 240. In another example, second III-N structure 220b (e.g., LNA 116) includes two drain terminals 230 (230d-e), one source terminal 240 (240c), and two gate terminals 260 (260e-f).

In one implementation, a PA 114 has about thirty times as many gate terminals 260 as an LNA 116, a VR 112 has about five to ten times as many gate terminals 260 as the PA 114, a switch 118 has about the same amount of gate terminals 260 as the PA 114, and NMOS logic 120 has about one-hundredth the amount of gates as the PA 114. In one implementation, a transistor width may be the width of a III-N structure 220 in the direction of the first TCN to the last TCN. In another implementation a transistor width may be a distance from a first TCN of a III-N structure 220 to the last TCN of the III-N structure 220. The transistor width of NMOS logic 120 is about 0.05-0.5 microns. The transistor width of LNA 116 is about 20 to 40 microns. The transistor width of the PA 114 is about 500 microns to 1 millimeter (mm). The transistor width of the switch 118 is about 1 to 2 mm. The transistor width of the VR 112 is about 5 to 10 mm.

The PA 114 has source terminals 240 coupled to a ground node, gate terminals 260 coupled to an input node, and drain terminals coupled to an output node. The NMOS logic 120 and LNA 116 may configured similar to the PA 114. The switch 118 has gate terminals 260 coupled to a ground node, source terminals 240 coupled to an input node or an output node, and drain terminals 230 coupled to the input node or the output node (e.g., opposite to which the source terminals 240 are coupled). The VR 112 has stacked transistors including a first transistor (drain terminal 230a, source terminal 240a, gate terminal 260a) and a second transistor (drain terminal 230b, source terminal 240b, gate terminal 260b). The drain terminal 230a of the first transistor is coupled to the source terminal 240b of a second transistor and is coupled to the output node (e.g., is the output of the stack of transistors). The gate terminal 260a of the first transistor is coupled to a first control signal and the source terminal 240a of the first transistor is coupled to the ground node. The gate terminal 260b of the second transistor is coupled to a second control signal and the drain terminal 230b of the second transistor is coupled to a battery. CMOS logic (e.g., CMOS companion chip 126) may be configured similar to the VR 112.

Figure 5:
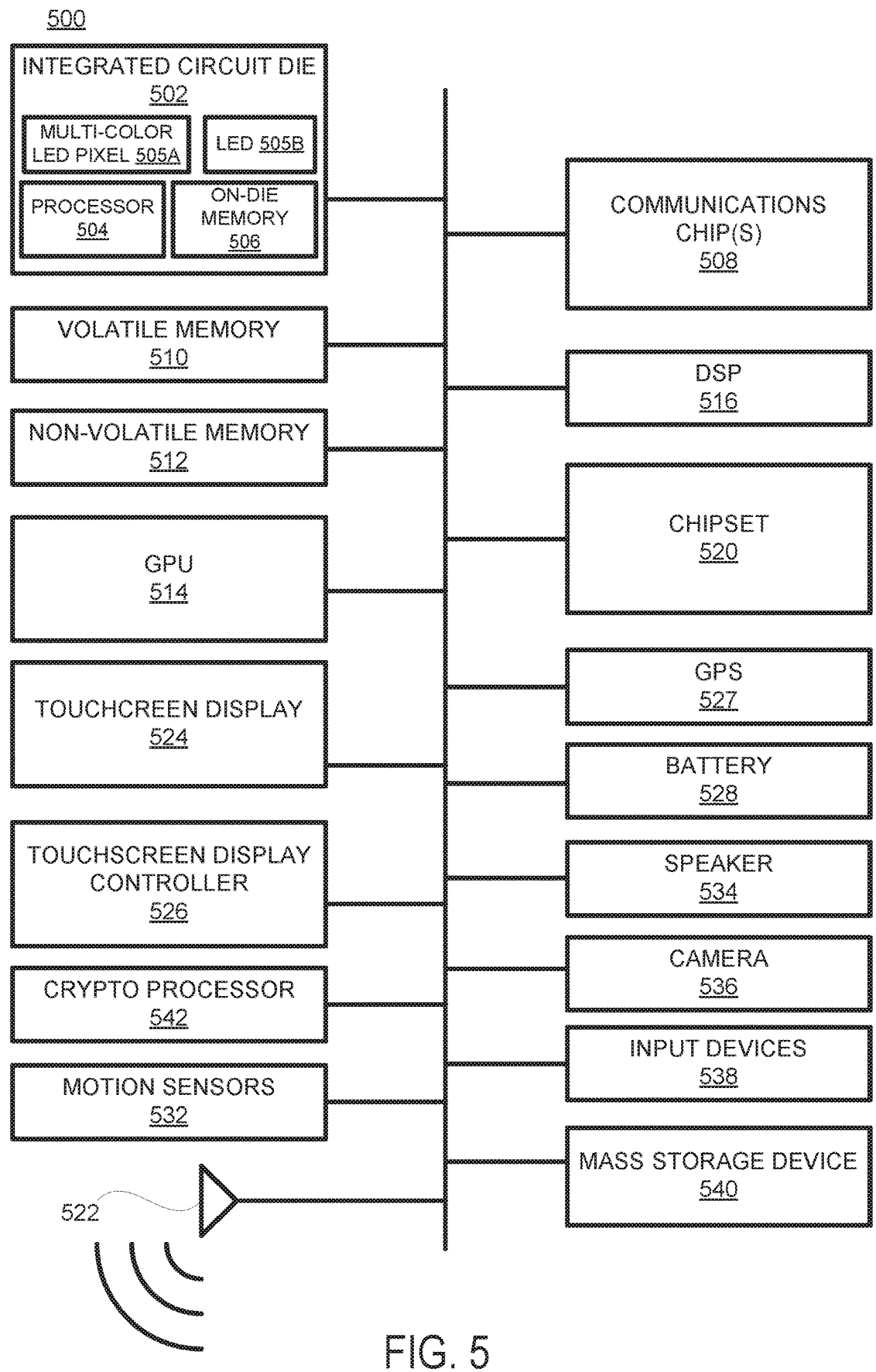
FIG. 5 is a computing device built in accordance with an implementation of the present disclosure.

FIG. 5 is a computing device built in accordance with an implementation of the present disclosure. The computing device 500 may include a number of components. In one implementation, the components are attached to one or more motherboards. In an alternate implementation, some or all of these components are fabricated onto a single system-on-a-chip (SoC) die, such as an SoC used for mobile devices. The components in the computing device 500 include, but are not limited to, an integrated circuit die 502 and at least one communications logic unit 508. In some implementations the communications logic unit 508 is fabricated within the integrated circuit die 502 while in other implementations the communications logic unit 508 is fabricated in a separate integrated circuit chip that may be bonded to a substrate or motherboard that is shared with or electronically coupled to the integrated circuit die 502. The integrated circuit die 502 may include a CPU 504 as well as on-die memory 506, often used as cache memory that can be provided by technologies such as embedded DRAM (eDRAM), SRAM, or spin-transfer torque memory (STT-MRAM). It may be noted that in implementations integrated circuit die 502 may include fewer elements (e.g., without processor 504 and/or on-die memory 506) or additional elements other than processor 504 and on-die memory 506. In one example, integrated circuit die 502 may be an LED, such as a monolithic multi-color LED pixel 505A or non-monolithic LED 505B, with or without processor 504 and/or on-die memory 506. In another example, integrated circuit die 502 may be LED display with multiple monolithic multi-color LED pixels 505A (or multiple LEDs 505B) and a TFT backplane, with or without processor 504 and/or on-die memory 506. In another example, integrated circuit die 502 may include some or all the elements described herein, as well as include additional elements.

Computing device 500 may include other components that may or may not be physically and electrically coupled to the motherboard or fabricated within an SoC die. These other components include, but are not limited to, volatile memory 510 (e.g., DRAM), non-volatile memory 512 (e.g., ROM or flash memory), a graphics processing unit 514 (GPU), a digital signal processor 516, a crypto processor 542 (e.g., a specialized processor that executes cryptographic algorithms within hardware), a chipset 520, at least one antenna 522 (in some implementations two or more antenna may be used), a display or a touchscreen display 524 (e.g., that may include integrated circuit die 502), a touchscreen controller 526, a battery 528 or other power source, a power amplifier (not shown), a voltage regulator (not shown), a global positioning system (GPS) device 527, a compass (not shown), a motion coprocessor or sensors 532 (that may include an accelerometer, a gyroscope, and a compass), a microphone (not shown), a speaker 534, a camera 536, user input devices 538 (such as a keyboard, mouse, stylus, and touchpad), and a mass storage device 540 (such as hard disk drive, compact disk (CD), digital versatile disk (DVD), and so forth). The computing device 500 may incorporate further transmission, telecommunication, or radio functionality not already described herein. In some implementations, the computing device 500 includes a radio that is used to communicate over a distance by modulating and radiating electromagnetic waves in air or space. In further implementations, the computing device 500 includes a transmitter and a receiver (or a transceiver) that is used to communicate over a distance by modulating and radiating electromagnetic waves in air or space.

The communications logic unit 508 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some implementations they might not. The communications logic unit 508 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 500 may include a plurality of communications logic units 508. For instance, a first communications logic unit 508 may be dedicated to shorter range wireless communications such as Wi-Fi, NFC, and Bluetooth and a second communications logic unit 508 may be dedicated to longer range wireless communications such as GPS, EDGE, GPRS, CDMA, WiMAX, LTE, Ev-DO, and others.

The processor 504 (also referred to "processing device" herein) of the computing device 500 includes one or more devices, such as transistors, RF filters, or LEDs, that are formed in accordance with implementations of the present disclosure. The term "processor" or "processing device" may refer to any device or portion of a device that processes electronic data from registers and/or memory to transform that electronic data into other electronic data that may be stored in registers and/or memory. Processor 504 represents one or more general-purpose processing devices such as a microprocessor, a central processing unit, or the like. More particularly, the processor 504 may be complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 504 may also be one or more special-purpose processing devices such as an application specific integrated circuit (ASIC), a field programmable gate array (FPGA), a digital signal processor (DSP), network processor, or the like.

The communications logic unit 508 may also include one or more devices, such as transistors, RF filters, or LEDs, that are formed in accordance with implementations of the present disclosure.

In further implementations, another component housed within the computing device 500 may contain one or more devices, such as transistors, RF filters, or LEDs, that are formed in accordance with implementations of the present disclosure.

In various implementations, the computing device 500 may be a laptop computer, a netbook computer, a notebook computer, an ultrabook computer, a smartphone, a dumbphone, a tablet, a tablet/laptop hybrid, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

The following examples pertain to further embodiments.

Example 1 is an apparatus comprising a group III-nitride (III-N) integrated radio frequency (RF) front-end circuit comprising: a semiconductor substrate; a plurality of functional blocks, each of the plurality of functional blocks comprising a III-N structure on the semiconductor substrate, wherein the III-N integrated RF front-end circuit is to be coupled to an antenna.

In Example 2, the apparatus of Example 1, wherein the plurality of functional blocks comprises: a power amplifier (PA) comprising a first III-N structure on the semiconductor substrate; and a low-noise amplifier (LNA) comprising a second III-N structure on the semiconductor substrate.

In Example 3, the apparatus of any one of Examples 1-2, wherein the plurality of functional blocks further comprises: a voltage regulator (VR) comprising a third III-N structure on the semiconductor substrate; and an n-type metal-oxide-semiconductor logic (NMOS) comprising a fourth III-N structure on the semiconductor substrate.

In Example 4, the apparatus of any one of Examples 1-3, wherein the plurality of functional blocks further comprises a switch comprising a fifth III-N structure on the semiconductor substrate.

In Example 5, the apparatus of any one of Examples 1-4, wherein the plurality of functional blocks is coupled to a second plurality of functional blocks, the second plurality of functional blocks comprising: a voltage regulator (VR) comprising a third III-N structure on a second semiconductor substrate; and an n-type metal-oxide-semiconductor logic (NMOS) comprising a fourth III-N structure on the second semiconductor substrate.

In Example 6, the apparatus of any one of Examples 1-5, wherein the plurality of functional blocks is coupled to a switch, the switch comprising a fifth III-N structure on a third semiconductor substrate.

In Example 7, the apparatus of any one of Examples 1-6, wherein the III-N structure is a gallium nitride (GaN) structure.

In Example 8, the apparatus of any one of Examples 1-7, wherein a wireless communication device comprises: the III-N integrated RF front-end circuit; the antenna; filters coupled between the antenna and the III-N integrated RF front-end circuit; and silicon complementary metal-oxide-semiconductor (Si CMOS) logic coupled to the III-N integrated RF front-end circuit.

In Example 9, the apparatus of any one of Examples 1-8, wherein each of the plurality of functional blocks comprises: a gallium nitride (GaN) structure above the semiconductor substrate; a plurality of source terminals on the GaN structure; a plurality of drain terminals on the GaN structure; and a plurality of gate terminals above the GaN structure, wherein each of the plurality of gate terminals is between a source terminal of the plurality of source terminals and a drain terminal of the plurality of drain terminals.

In Example 10, the apparatus of any one of Examples 1-9, wherein each GaN structure is grown directly on the semiconductor substrate, wherein the GaN structures are separated by one or more shallow trench isolations (STI).

In Example 11, the apparatus of any one of Examples 1-10, wherein the semiconductor substrate comprises silicon.

Example 12 is an integrated circuit die comprising: a semiconductor substrate; a group III-nitride (III-N) structure above the semiconductor substrate; a source terminal and a drain terminal on the III-N structure; a polarization layer above the III-N structure between the source terminal and the drain terminal; and a gate terminal above the polarization layer.

In Example 13, the integrated circuit die of any one of Example 12 further comprising: a first trench contact on the drain terminal; a second trench contact on the source terminal; an aluminum nitride (AlN) layer on the III-N structure between the source terminal and the drain terminal, wherein the polarization layer is on the AlN layer; and a high-k dielectric layer, wherein: the gate terminal is a t-shape and comprises a lower portion and an upper portion; a first portion of the high-k dielectric layer is on the lower surface of the lower portion of the gate terminal; a second portion of the high-k dielectric layer is on sidewalls of the lower portion of the gate terminal; and the polarization layer is between the AlN layer and the first portion of the high-k dielectric layer.

In Example 14, the integrated circuit die of any one of Examples 12-13, further comprising: a first shallow trench isolation (STI) and a second STI on the semiconductor substrate; and a first layer of III-N on the semiconductor substrate between the first STI and the second STI, wherein the III-N structure is on the first layer of III-N.

In Example 15, the integrated circuit die of any one of Examples 12-14, further comprising: a first spacer on the polarization layer and the second portion of the high-k dielectric layer; a second spacer on the first spacer and on the second portion of the high-k dielectric layer; a first inter-layer dielectric (ILD) on the first STI, the second STI, the III-N structure, the drain terminal, the source terminal, the first trench contact, first spacer, the second spacer, a lower surface of the upper portion of the gate terminal, and the second trench contact; and a second ILD on the first ILD, the first trench contact, sidewalls of the upper portion of the gate terminal, and the second trench contact.

In Example 16, the integrated circuit die of any one of Examples 12-15, wherein: the semiconductor substrate is a silicon (Si) (111) structure; the first STI and the second STI are a first oxide; the III-N structure and first layer of III-N are gallium nitride (GaN); the polarization layer is indium aluminum nitride (InAlN); the first spacer is a silicon oxide; the second spacer is a silicon nitride; and the first ILD is a second oxide.

In Example 17, the integrated circuit die of any one of Examples 12-16, wherein: the source terminal comprises indium gallium nitride (InGaN) and n-type doping; and the drain terminal comprises InGaN and n-type doping.

In Example 18, the integrated circuit die of any one of Examples 12-17, wherein the III-N structure is grown directly on the semiconductor substrate in a reactor.

Example 19 is a method of fabricating a group III-nitride (III-N) integrated radio frequency (RF) front-end circuit, the method comprising: forming a III-N structure above a semiconductor substrate; forming a polarization layer above the III-N structure; forming a source terminal and a drain terminal on the III-N structure, wherein the polarization layer is between the source terminal and the drain terminal; and forming a gate terminal above the polarization layer.

In Example 20, the integrated circuit die of Example 19 further comprising: forming a first trench contact on the drain terminal; forming a second trench contact on the source terminal; forming an aluminum nitride (AlN) layer on the III-N structure between the source terminal and the drain terminal, wherein the polarization layer is formed on the AlN layer; and forming a high-k dielectric layer, wherein: the gate terminal is a t-shape and comprises a lower portion and an upper portion; a first portion of the high-k dielectric layer is formed on the lower surface of the lower portion of the gate terminal; a second portion of the high-k dielectric layer is formed on sidewalls of the lower portion of the gate terminal; and the polarization layer is between the AlN layer and the first portion of the high-k dielectric layer.

In Example 21, the integrated circuit die of any one of Examples 19-20 further comprising: forming a first shallow trench isolation (STI) and a second STI on the semiconductor substrate; and forming a first layer of III-N on the semiconductor substrate between the first STI and the second STI, wherein the III-N structure is formed on the first layer of III-N.

In Example 22, the integrated circuit die of any one of Examples 19-21, further comprising: disposing a first spacer on the polarization layer and the second portion of the high-k dielectric layer; disposing a second spacer on the first spacer and on the second portion of the high-k dielectric layer; disposing a first inter-layer dielectric (ILD) on the first STI, the second STI, the III-N structure, the drain terminal, the source terminal, the first trench contact, first spacer, the second spacer, a lower surface of the upper portion of the gate terminal, and the second trench contact; and disposing a second ILD on the first ILD, the first trench contact, sidewalls of the upper portion of the gate terminal, and the second trench contact.

In Example 23, the integrated circuit die of any one of Examples 19-22, wherein: the semiconductor substrate is a silicon (Si) (111) structure; the first STI and the second STI are a first oxide; the III-N structure and first layer of III-N are gallium nitride (GaN); the polarization layer is indium aluminum nitride (InAlN); the first spacer is a silicon oxide; the second spacer is a silicon nitride; the first ILD is a second oxide; the source terminal comprises indium gallium nitride (InGaN) and n-type doping; and the drain terminal comprises InGaN and n-type doping.

In Example 24, the integrated circuit die of any one of Examples 19-23, wherein the III-N structure is grown directly on the semiconductor substrate in a reactor.

Example 25 is one or more functional blocks of a group III-nitride (III-N) integrated radio frequency (RF) front-end circuit, each functional block comprising a group III-nitride (III-N) structure on a semiconductor substrate.

In Example 26, the one or more functional blocks of Example 25, wherein each functional block further comprises a source terminal and a drain terminal on the III-N structure; a polarization layer above the III-N structure between the source terminal and the drain terminal; and a gate terminal above the polarization layer.

In Example 27, the one or more functional blocks of any one of Examples 25-26, wherein each functional block further comprises: a first trench contact on the drain terminal; a second trench contact on the source terminal; an aluminum nitride (AlN) layer on the III-N structure between the source terminal and the drain terminal, wherein the polarization layer is on the AlN layer; and a high-k dielectric layer, wherein: the gate terminal is a t-shape and comprises a lower portion and an upper portion; a first portion of the high-k dielectric layer is on the lower surface of the lower portion of the gate terminal; a second portion of the high-k dielectric layer is on sidewalls of the lower portion of the gate terminal; and the polarization layer is between the AlN layer and the first portion of the high-k dielectric layer.

In Example 28, the one or more functional blocks of any one of Examples 25-27, wherein each functional block further comprises: a first shallow trench isolation (STI) and a second STI on the semiconductor substrate; and a first layer of III-N on the semiconductor substrate between the first STI and the second STI, wherein the III-N structure is on the first layer of III-N.

In Example 29, the one or more functional blocks of any one of Examples 25-28, wherein each functional block further comprises: a first spacer on the polarization layer and the second portion of the high-k dielectric layer; a second spacer on the first spacer and on the second portion of the high-k dielectric layer; a first inter-layer dielectric (ILD) on the first STI, the second STI, the III-N structure, the drain terminal, the source terminal, the first trench contact, first spacer, the second spacer, a lower surface of the upper portion of the gate terminal, and the second trench contact; and a second ILD on the first ILD, the first trench contact, sidewalls of the upper portion of the gate terminal, and the second trench contact.

In Example 30, the one or more functional blocks of any one of Examples 25-29, wherein: the semiconductor substrate is a silicon (Si) (111) structure; the first STI and the second STI are a first oxide; the III-N structure and first layer of III-N are gallium nitride (GaN); the polarization layer is indium aluminum nitride (InAlN); the first spacer is a silicon oxide; the second spacer is a silicon nitride; and the first ILD is a second oxide.

In Example 31, the one or more functional blocks of any one of Examples 25-30, wherein: the source terminal comprises indium gallium nitride (InGaN) and n-type doping; and the drain terminal comprises InGaN and n-type doping.

In Example 32, the one or more functional blocks of any one of Examples 25-31, wherein the III-N structure is grown directly on the semiconductor substrate in a reactor.

In Example 33, the one or more functional blocks of any one of Examples 25-32 comprise a first functional block comprising a power amplifier (PA), the PA comprising a first III-N structure on the semiconductor substrate.

In Example 34, the one or more functional blocks of any one of Examples 25-33 comprise a second functional block comprising a low-noise amplifier (LNA), the LNA comprising a second III-N structure on the semiconductor substrate.

In Example 35, the one or more functional blocks of any one of Examples 25-34 comprise a third functional block comprising a voltage regulator (VR), the VR comprising a third III-N structure on the semiconductor substrate.

In Example 36, the one or more functional blocks of any one of Examples 25-35 comprise a fourth functional block comprising an n-type metal-oxide-semiconductor logic (NMOS), the NMOS comprising a fourth III-N structure on the semiconductor substrate.

In Example 37, the one or more functional blocks of any one of Examples 25-36 comprise a fifth functional block comprising a switch, the switch comprising a fifth III-N structure on the semiconductor substrate.

In Example 38, the one or more functional blocks of any one of Examples 25-37, wherein at least one of the one or more functional blocks is to be coupled to one or more filters.

In Example 39, the one or more functional blocks of any one of Examples 25-38, wherein at least one of the one or more functional blocks is to be coupled to an antenna.

In Example 40, the one or more functional blocks of any one of Examples 25-39, wherein at least one of the one or more functional blocks is coupled a complementary metal-oxide-semiconductor (CMOS) companion chip.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

Various operations are described as multiple discrete operations, in turn, in a manner that is most helpful in understanding the present disclosure, however, the order of description should not be construed to imply that these operations are necessarily order dependent. In particular, these operations need not be performed in the order of presentation.

The terms "over," "above" "under," "between," and "on" as used herein refer to a relative position of one material layer or component with respect to other layers or components. For example, one layer disposed above or over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to Germanium, Indium Antimonide, Lead Telluride, Iridium Arsenide, Indium Phosphide, Gallium Arsenide, Indium Gallium Arsenide, Gallium Antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as Hafnium, Silicon, Oxygen, Titanium, Tantalum, Lanthanum, Aluminum, Zirconium, Barium, Strontium, Yttrium, Lead, Scandium, Niobium, and Zinc. Examples of high-k materials that may be used in the gate dielectric layer include, but are not limited to, Hafnium Oxide, Hafnium Silicon Oxide, Lanthanum Oxide, Lanthanum Aluminum Oxide, Zirconium Oxide, Zirconium Silicon Oxide, Tantalum Oxide, Titanium Oxide, Barium Strontium Titanium Oxide, Barium Titanium Oxide, Strontium Titanium Oxide, Yttrium Oxide, Aluminum Oxide, Lead Scandium Tantalum Oxide, and Lead Zinc Niobate. In some implementations, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer. Further metal layers may be included for other purposes, such as a barrier layer.

For a PMOS transistor, metals that may be used for the gate electrode include, but are not limited to, Ruthenium, Palladium, Platinum, Cobalt, Nickel, and conductive metal oxides, e.g., Ruthenium Oxide. A P-type metal layer will enable the formation of a PMOS gate electrode with a workfunction that is between about 4.9 eV and about 5.2 eV. For an NMOS transistor, metals that may be used for the gate electrode include, but are not limited to, Hafnium, Zirconium, Titanium, Tantalum, Aluminum, alloys of these metals, and carbides of these metals such as Hafnium Carbide, Zirconium Carbide, Titanium Carbide, Tantalum Carbide, and Aluminum Carbide. An N-type metal layer will enable the formation of an NMOS gate electrode with a workfunction that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as Silicon Nitride, Silicon Oxide, Silicon Carbide, Silicon Nitride doped with Carbon, and Silicon Oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

In implementations, source and drain regions are formed within the substrate adjacent to the gate stack of each MOS transistor. The source and drain regions may be formed using either an implantation/diffusion process or an etching/deposition process. In the former process, dopants such as Boron, Aluminum, Antimony, Phosphorous, or Arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a Silicon alloy such as Silicon Germanium or Silicon Carbide. In some implementations, the epitaxially deposited silicon alloy may be doped in situ with dopants such as Boron, Arsenic, or Phosphorous. In further implementations, the source and drain regions may be formed using one or more alternate semiconductor materials such as germanium or a group III-V material or alloy. In further implementations, one or more layers of metal and/or metal alloys may be used to form the source and drain regions.

In other implementations, one or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, Silicon Dioxide ($SiO_2$), Carbon doped oxide (CDO), Silicon Nitride, organic polymers such as Perfluorocyclobutane or Polytetrafluoroethylene, Fluorosilicate glass (FSG), and organosilicates such as Silsesquioxane, Siloxane, or Organosilicate glass. The ILD layers may include pores or air gaps to further reduce their dielectric constant.

What is claimed is:

1. An apparatus comprising:
   a group III-nitride (III-N) integrated radio frequency (RF) front-end circuit comprising:
   a semiconductor substrate comprising silicon;
   a plurality of functional blocks, each of the plurality of functional blocks comprising a III-N discrete structure directly on the semiconductor substrate, wherein the III-N integrated RF front-end circuit is to be coupled to an antenna.

2. The apparatus of claim 1, wherein the plurality of functional blocks comprises:
   a power amplifier (PA) comprising a first III-N structure on the semiconductor substrate; and
   a low-noise amplifier (LNA) comprising a second III-N structure on the semiconductor substrate.

3. The apparatus of claim 2, wherein the plurality of functional blocks further comprises:
   a voltage regulator (VR) comprising a third III-N structure on the semiconductor substrate; and
   an n-type metal-oxide-semiconductor logic (NMOS) comprising a fourth III-N structure on the semiconductor substrate.

4. The apparatus of claim 3, wherein the plurality of functional blocks further comprises a switch comprising a fifth III-N structure on the semiconductor substrate.

5. The apparatus of claim 2, wherein the plurality of functional blocks is coupled to a second plurality of functional blocks, the second plurality of functional blocks comprising:
   a voltage regulator (VR) comprising a third III-N structure on a second semiconductor substrate; and
   an n-type metal-oxide-semiconductor logic (NMOS) comprising a fourth III-N structure on the second semiconductor substrate.

6. The apparatus of claim 5, wherein the plurality of functional blocks is coupled to a switch, the switch comprising a fifth III-N structure on a third semiconductor substrate.

7. The apparatus of claim 1, wherein the III-N structure is a gallium nitride (GaN) structure.

8. The apparatus of claim 1, wherein a wireless communication device comprises:
   the III-N integrated RF front-end circuit;
   the antenna;
   filters coupled between the antenna and the III-N integrated RF front-end circuit; and
   a silicon complementary metal-oxide-semiconductor (Si CMOS) logic structure coupled to the III-N integrated RF front-end circuit.

9. The apparatus of claim 1, wherein each of the plurality of functional blocks comprises:
   a gallium nitride (GaN) structure above the semiconductor substrate;
   a plurality of source terminals on the GaN structure;
   a plurality of drain terminals on the GaN structure; and
   a plurality of gate terminals above the GaN structure, wherein each of the plurality of gate terminals is between a source terminal of the plurality of source terminals and a drain terminal of the plurality of drain terminals.

10. The apparatus of claim 9, wherein each GaN structure is grown directly on the semiconductor substrate, wherein the GaN structures are separated by one or more shallow trench isolations (STI).

11. An integrated circuit die comprising:
a semiconductor substrate comprising silicon;
a first group III-nitride (III-N) discrete structure directly on the semiconductor substrate;
a source terminal and a drain terminal on the first III-N discrete structure;
a polarization layer above the first III-N discrete structure between the source terminal and the drain terminal;
a gate terminal above the polarization layer; and
a second III-N discrete structure directly on the semiconductor substrate, the second III-N discrete structure discontinuous with the first III-N discrete structure.

12. The integrated circuit die of claim 11 further comprising:
a first trench contact on the drain terminal;
a second trench contact on the source terminal;
an aluminum nitride (AlN) layer on the III-N structure between the source terminal and the drain terminal, wherein the polarization layer is on the AlN layer; and
a high-k dielectric layer, wherein: the gate terminal is a t-shape and comprises a lower portion and an upper portion;
a first portion of the high-k dielectric layer is on the lower surface of the lower portion of the gate terminal;
a second portion of the high-k dielectric layer is on sidewalls of the lower portion of the gate terminal; and
the polarization layer is between the AlN layer and the first portion of the high-k dielectric layer.

13. The integrated circuit die of claim 12 further comprising:
a first shallow trench isolation (STI) and a second STI on the semiconductor substrate; and
a first layer of III-N on the semiconductor substrate between the first STI and the second STI, wherein the III-N structure is on the first layer of III-N.

14. The integrated circuit die of claim 13 further comprising:
a first spacer on the polarization layer and the second portion of the high-k dielectric layer;
a second spacer on the first spacer and on the second portion of the high-k dielectric layer;
a first inter-layer dielectric (ILD) on the first STI, the second STI, the first III-N discrete structure, the drain terminal, the source terminal, the first trench contact, first spacer, the second spacer, a lower surface of the upper portion of the gate terminal, and the second trench contact; and
a second ILD on the first ILD, the first trench contact, sidewalls of the upper portion of the gate terminal, and the second trench contact.

15. The integrated circuit die of claim 14, wherein:
the semiconductor substrate is a silicon (Si) (111) structure;
the first STI and the second STI are a first oxide;
the first III-N discrete structure and first layer of III-N are gallium nitride (GaN);
the polarization layer is indium aluminum nitride (InAlN);
the first spacer is a silicon oxide;
the second spacer is a silicon nitride; and
the first ILD is a second oxide.

16. The integrated circuit die of claim 11, wherein:
the source terminal comprises indium gallium nitride (InGaN) and n-type doping; and
the drain terminal comprises InGaN and n-type doping.

17. The integrated circuit die of claim 11, wherein the first III-N discrete structure and the second III-N discrete structure are grown directly on the semiconductor substrate in a reactor.

18. An integrated circuit die comprising:
a semiconductor substrate;
a group III-nitride (III-N) structure above the semiconductor substrate;
a source terminal and a drain terminal on the III-N structure;
a polarization layer above the III-N structure between the source terminal and the drain terminal;
a gate terminal above the polarization layer;
a first trench contact on the drain terminal;
a second trench contact on the source terminal;
an aluminum nitride (AlN) layer on the III-N structure between the source terminal and the drain terminal, wherein the polarization layer is on the AlN layer; and
a high-k dielectric layer, wherein: the gate terminal is a t-shape and comprises a lower portion and an upper portion;
a first portion of the high-k dielectric layer is on the lower surface of the lower portion of the gate terminal;
a second portion of the high-k dielectric layer is on sidewalls of the lower portion of the gate terminal; and
the polarization layer is between the AlN layer and the first portion of the high-k dielectric layer.

19. The integrated circuit die of claim 18 further comprising:
a first shallow trench isolation (STI) and a second STI on the semiconductor substrate; and
a first layer of III-N on the semiconductor substrate between the first STI and the second STI, wherein the III-N structure is on the first layer of III-N.

20. The integrated circuit die of claim 19 further comprising:
a first spacer on the polarization layer and the second portion of the high-k dielectric layer;
a second spacer on the first spacer and on the second portion of the high-k dielectric layer;
a first inter-layer dielectric (ILD) on the first STI, the second STI, the III-N structure, the drain terminal, the source terminal, the first trench contact, first spacer, the second spacer, a lower surface of the upper portion of the gate terminal, and the second trench contact; and
a second ILD on the first ILD, the first trench contact, sidewalls of the upper portion of the gate terminal, and the second trench contact.

21. The integrated circuit die of claim 20, wherein:
the semiconductor substrate is a silicon (Si) (111) structure;
the first STI and the second STI are a first oxide;
the III-N structure and first layer of III-N are gallium nitride (GaN);
the polarization layer is indium aluminum nitride (InAlN);
the first spacer is a silicon oxide;
the second spacer is a silicon nitride; and
the first ILD is a second oxide.

* * * * *